(12) United States Patent
Ding

(10) Patent No.: US 6,844,586 B2
(45) Date of Patent: Jan. 18, 2005

(54) FABRICATION OF GATE DIELECTRIC IN NONVOLATILE MEMORIES HAVING SELECT, FLOATING AND CONTROL GATES

(75) Inventor: Yi Ding, Sunnyvale, CA (US)

(73) Assignee: ProMOS Technologies, Inc., Hsin-Chu (TW)

( * ) Notice: Subject to any disclaimer, the term of this patent is extended or adjusted under 35 U.S.C. 154(b) by 37 days.

(21) Appl. No.: 10/803,599

(22) Filed: Mar. 17, 2004

(65) Prior Publication Data

US 2004/0227178 A1 Nov. 18, 2004

Related U.S. Application Data

(62) Division of application No. 10/440,508, filed on May 16, 2003.

(51) Int. Cl.$^7$ .............................................. H01L 29/788
(52) U.S. Cl. ......................... 257/315; 257/337; 257/368
(58) Field of Search ................................ 257/315, 320, 257/333, 337, 366, 368, 395

(56) References Cited

U.S. PATENT DOCUMENTS

| | | | |
|---|---|---|---|
| 5,402,371 A | 3/1995 | Ono | |
| 5,856,943 A | 1/1999 | Jenq | |
| 5,901,084 A | 5/1999 | Ohnakado | |
| 6,057,575 A | 5/2000 | Jenq | |
| 6,130,129 A | 10/2000 | Chen | |
| 6,134,144 A | 10/2000 | Lin et al. | |
| 6,171,909 B1 | 1/2001 | Ding et al. | |
| 6,200,856 B1 | 3/2001 | Chen | |
| 6,261,903 B1 | 7/2001 | Chang et al. | |
| 6,266,278 B1 | 7/2001 | Harari et al. | |
| 6,326,661 B1 | 12/2001 | Dormans et al. | |
| 6,344,993 B1 * | 2/2002 | Harari et al. | 365/185.01 |
| 6,355,524 B1 | 3/2002 | Tuan et al. | |
| 6,365,457 B1 | 4/2002 | Choi | |
| 6,414,872 B1 | 7/2002 | Bergemont et al. | |
| 6,420,231 B1 | 7/2002 | Harari et al. | |
| 6,437,360 B1 | 8/2002 | Cho et al. | |
| 6,438,036 B2 | 8/2002 | Seki et al. | |
| 6,486,023 B1 | 11/2002 | Nagata | |
| 6,518,618 B1 | 2/2003 | Fazio et al. | |
| 6,541,324 B1 | 4/2003 | Wang | |
| 6,541,829 B2 | 4/2003 | Nishinohara et al. | |
| 2002/0064071 A1 | 5/2002 | Takahashi et al. | |
| 2002/0197888 A1 | 12/2002 | Huang et al. | |
| 2003/0218908 A1 | 11/2003 | Park et al. | |
| 2004/0004863 A1 | 1/2004 | Wang | |

FOREIGN PATENT DOCUMENTS

EP  0 938 098 A2  8/1999

OTHER PUBLICATIONS

Shirota, Riichiro "A Review of 256Mbit NAND Flash Memories and NAND Flash Future Trend," Feb. 2000, Nonvolatile Memory Workshop in Monterey, California, pp. 22–31.

Naruke, K.; Yamada, S.; Obi, E.; Taguchi, S.; and Wada, M. "A New Flash–Erase EEPROM Cell with A Sidewall Select– Gate On Its Source Side," 1989 IEEE, pp. 604–606.

Wu, A.T.; Chan T.Y.; Ko, P.K.; and Hu, C. "A Novel High–Speed, 5–Volt Programming EPROM Structure With Source–Side Injection," 1986 IEEE, 584–587.

(List continued on next page.)

Primary Examiner—Phuc T. Dang
(74) Attorney, Agent, or Firm—Michael Shenker; MacPherson Kwok Chen & Heid LLP

(57) ABSTRACT

In a nonvolatile memory, one or more peripheral transistor gates are formed from the same layer (140) as the select gate. The gate dielectric (130) for these peripheral transistors and the gate dielectric (130) for the select gates are formed simultaneously. In a nonvolatile memory, the gate dielectric (130) for the peripheral transistors and the gate dielectric (130) for the select gates (140) have the same thickness. Portions of the control gates (170) overlie the select gates.

12 Claims, 24 Drawing Sheets

OTHER PUBLICATIONS

Mizutani, Yoshihisa; and Makita, Koji "A New EPROM Cell With A Sidewall Floating Gate Fro High–Density and High Performance Device," 1985 IEEE, 635–638.

Ma, Y.; Pang, C.S.; Pathak, J.; Tsao, S.C.; Chang, C.F.; Yamauchi, Y.; Yoshimi, M. "A Novel High Density Contactless Flash Memory Array Using Split–Gate Source–Side–Injection Cell for 5V–Only Applications," 1994 Symposium on VLSI Technology Digest of Technical Papers, pp. 49–50.

Mih, Rebecca et al. "0.18um Modular Triple Self–Aligned Embedded Split–Gate Flash Memory," 2000 Symposium on VLSI Technology Digest of Technical Papers, pp. 120–121.

Ma, Yale et al., "Dual–Bit Split–Gate EEPROM (DSG) Cell in Contactless Array for Single Vcc High Density Flash Memories," 1994 IEEE, 3.5.1–3.5.4.

Spinelli, Alessandro S., "Quantum–Mechanical 2D Simulation of Surface–and Buried–Channel p–MOS,"2000 International Conference on Simulation of Semiconductor Processes and Devices: SISPAD 2000, Seattle, WA Sep. 6–8, 2000.

Kim, K.S. et al. "A Novel Dual String NOR (DuSnor) Memory Cell Technolgy Scalabe to the 256 Mbit and 1 Gbit Flash Memories," 1995 IEEE 11.1.1–11.1.4.

Bergemont, A. et al. "NOR Virtual Ground (NVG)– A New Scaling Concept for Very High Density FLAS EEPROM and its Implementation in a 0.5um Process," 1993 IEEE 2.2.1–2.2.4.

Van Duuren, Michiel et al., "Compact poly–CMP Embedded Flash Memory Cells For One or Two Bit Storage," Philips Research Leuven, Kapeldreef 75, B3001 Leuven, Belgium, pp. 73–74.

U.S. Appl. No. 10/440,466, entitled "Fabrication Of Conductive Gates For Nonvolatile Memories From Layers With Protruding Portions," Filed on May 16, 2003.

U.S. Appl. No. 10/440,005, entitled "Fabrication of Dielectric On A Gate Surface To Insulate The Gate From Another Element Of An Integrated Circuit," Filed on May 16, 2003.

U.S. Appl. No. 10/440,508, entitled "Fabrication Of Gate Dielectric In Nonvolatile Memories Having Select, Floating And Control Gates," Filed on May 16, 2003.

U.S. Appl. No. 10/440,500, entitled "Integrated Circuits With Openings that Allow Electrical Contact To Conductive Features Having Self–Aligned Edges," Filed on May 16, 2003.

U.S. Appl. No. 10/393,212, entitled "Nonvolatile Memories And Methods Of Fabrication," Filed Mar. 19, 2003.

U.S. Appl. No. 10/411, 813, entitled "Nonvolatile Memories With A Floating Gate Having An Upward Protrusion," Filed on Apr. 10, 2003.

U.S. Appl. No. 10/393,202, entitled "Fabrication of Integrated Circuit Elements In Structures With Protruding Features," Filed Mar. 19, 2003.

U.S. Appl. No. 10/631,941, entitled "Nonvolatile Memory Cell With Multiple Floating Gates Formed After The Select Gate," Filed on Jul. 30, 2003.

U.S. Appl. No. 10/632,155, entitled "Nonvolatile Memory Cells With Buried Channel Transistors," Filed on Jul. 30, 2003.

U.S. Appl. No. 10/632,007, entitled "Arrays Of Nonvolatile Memory Cells Wherin Each Cell Has Two Conductive Floating Gates," Filed on Jul. 30, 2003.

U.S. Appl. No. 10/631,452, entitled "Fabrication Of Dielectric For A Nonvolatile Memory Cell Having Multiple Floating Gates," Filed on Jul. 30, 2003.

U.S. Appl. No. 10/632,154, entitled "Fabrication Of Gate Dielectric In Nonvolatile Memories In Which A Memory Cell Has Multiple Floating Gates," Filed on Jul. 30, 2003.

U.S. Appl. No. 10/632,186, entitled "Nonvolatile Memory Cell With Multiple Floating Gates Formed After The Select Gate And Having Upward Protrusions," Filed on Jul. 30, 2003.

U.S. Appl. No. 10/631,552, entitled "Nonvolatile Memories And Methods Of Fabrication," Filed on Jul. 30, 2003.

U.S. Appl. No. 10/798,475, entitled "Fabrication of Conductive Lines Interconnecting Conductive Gates in Nonvolatile Memories and Non–Volatile Memory Structures," Filed on Mar. 10, 2004.

U.S. Appl. No. 10/797,972, entitled "Fabrication of Conductive Lines Interconnecting First Conductive Gates in Nonvolatile Memories Having Second Conductive Gates Provided By Conductive Gates Lines, Wherein The Adjacent Conductive Gate Lines For The Adjacent Columns Are Spaced From Each Other, And Non–Volatile Memory Structures," Filed on Mar. 10, 2004.

* cited by examiner

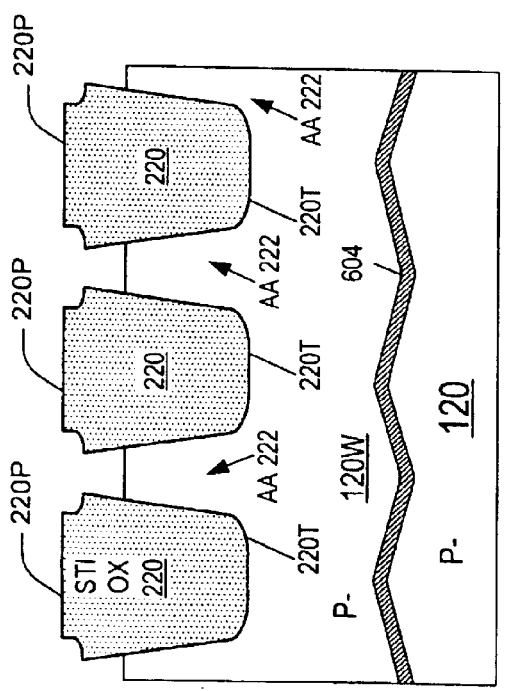
FIG. 4 (Y1-Y1')
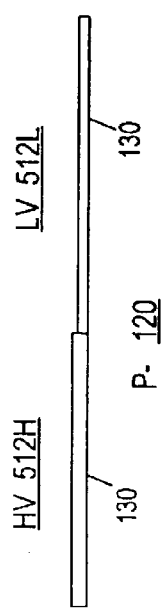
FIG. 5B (PERIPHERY)
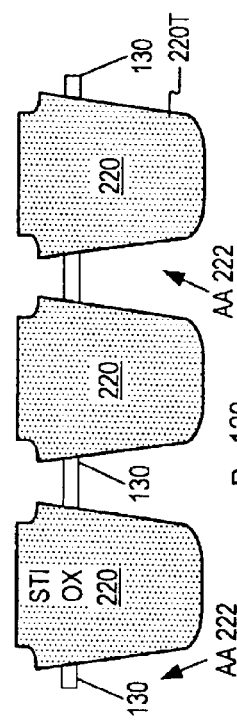
FIG. 5A (Y1-Y1')

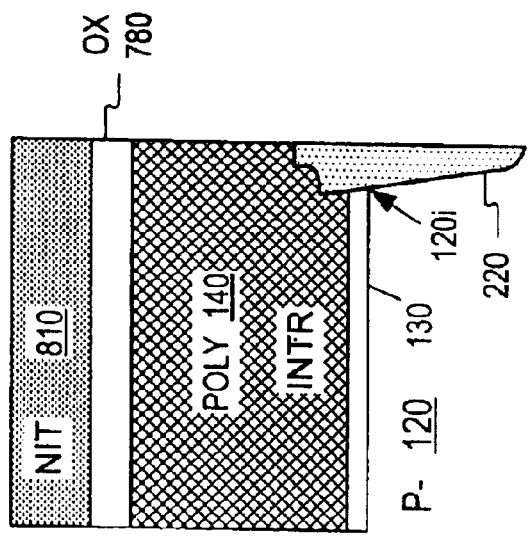
FIG. 6B (PERIPHERY)
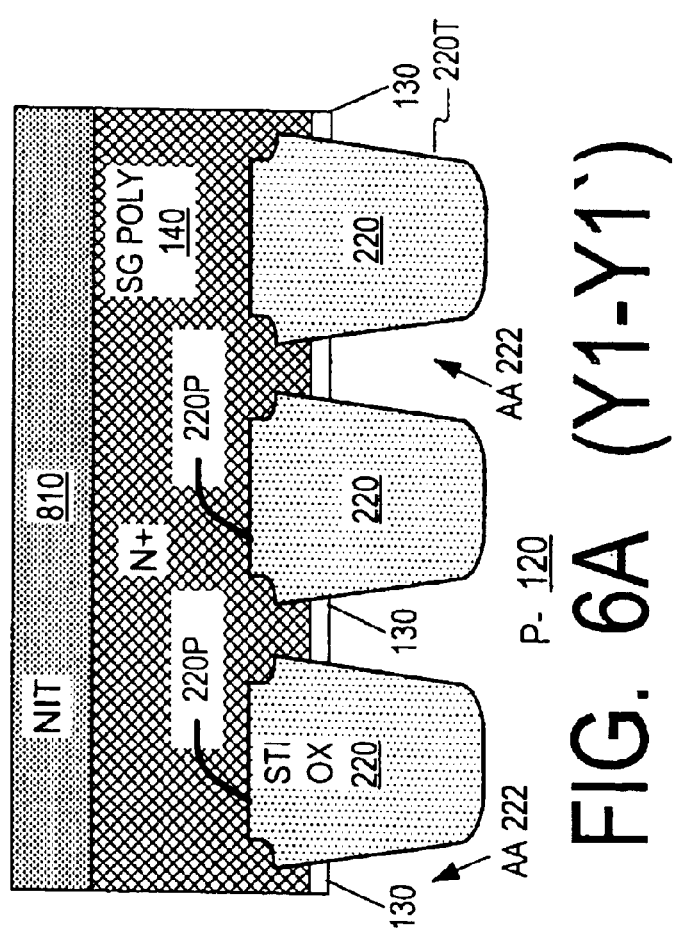
FIG. 6A (Y1-Y1')

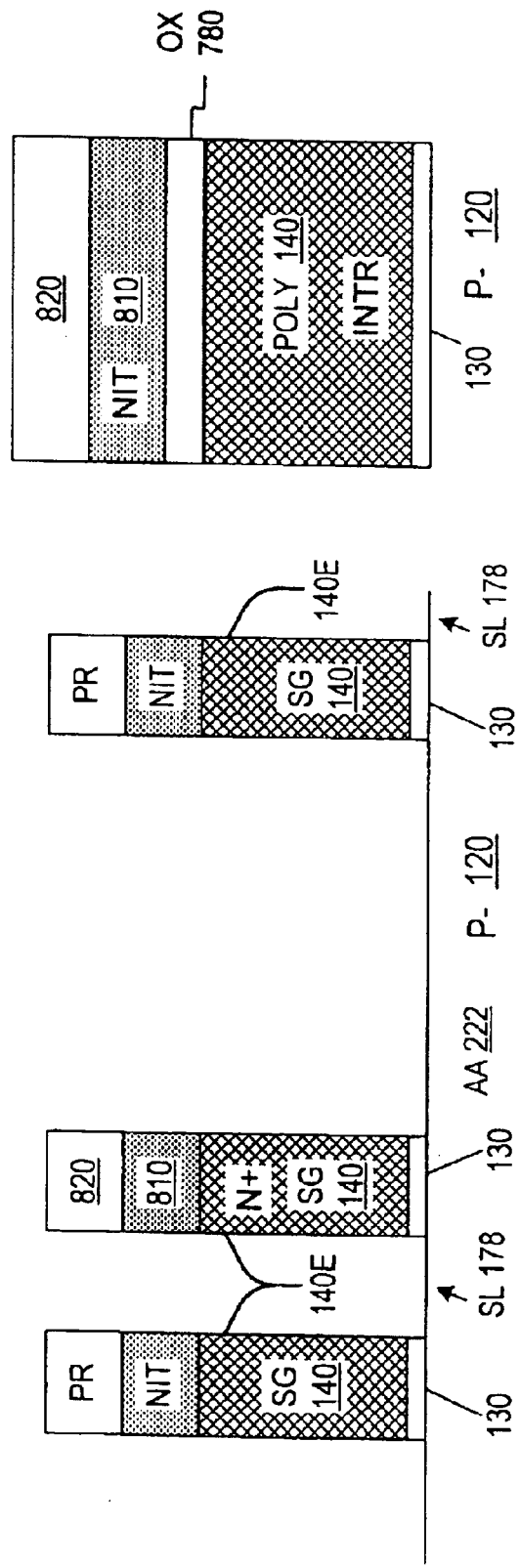

(X1-X1')

(X1-X1')

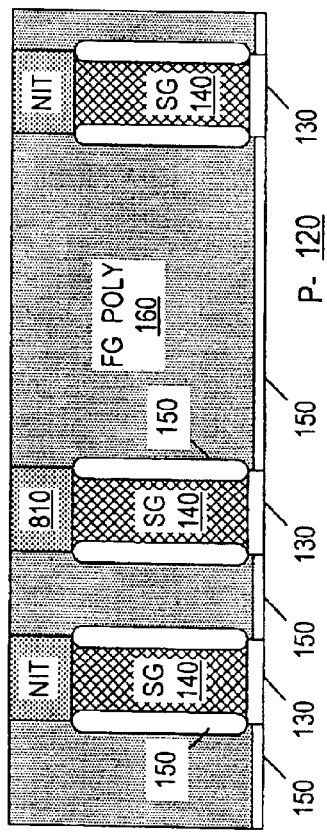
FIG. 10 (X1-X1')
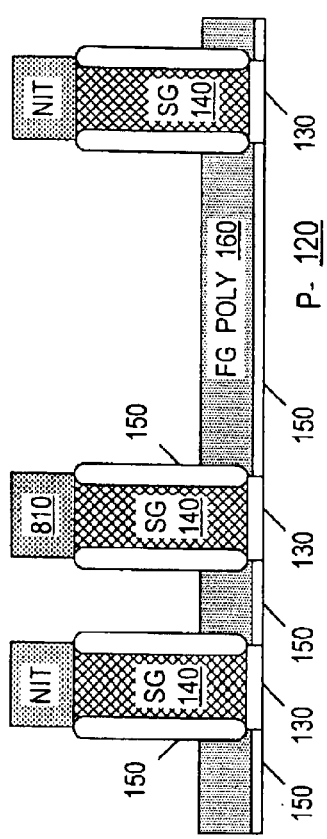
FIG. 11A (X1-X1')
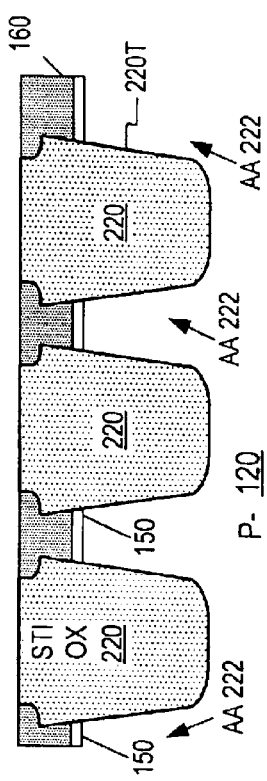
FIG. 11B (Y2-Y2')

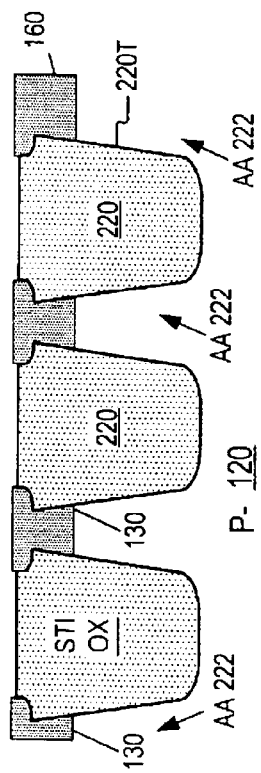
FIG. 12 (Y2-Y2')
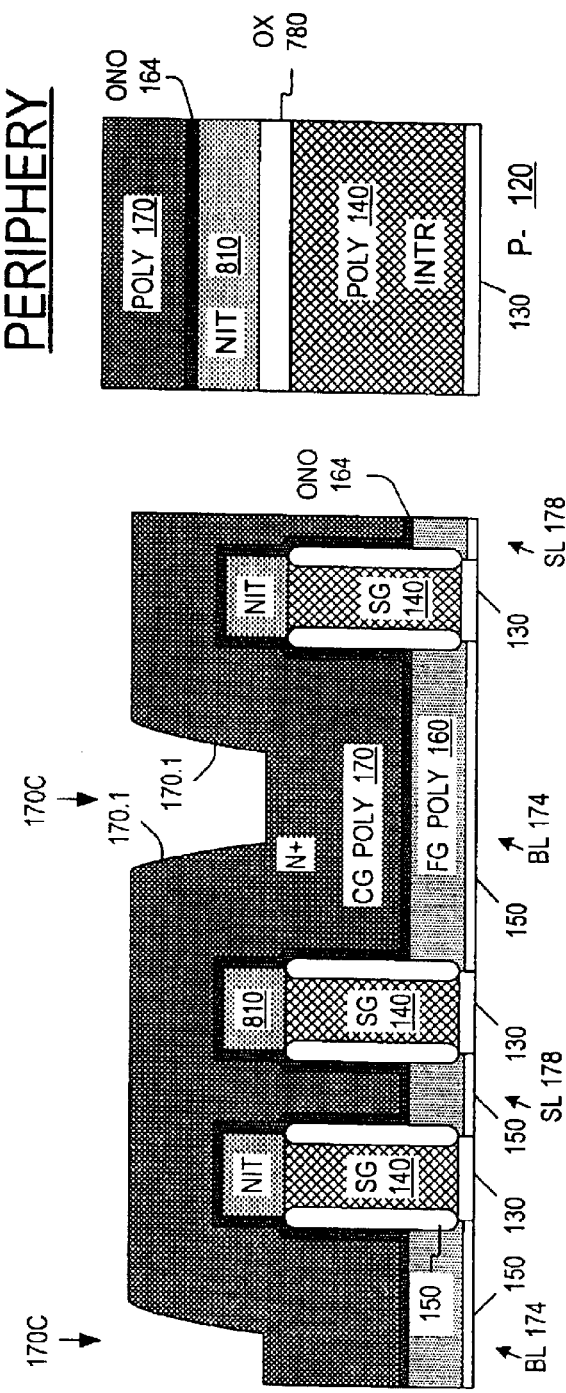
FIG. 13B
FIG. 13A (X1-X1')

(X1-X1')

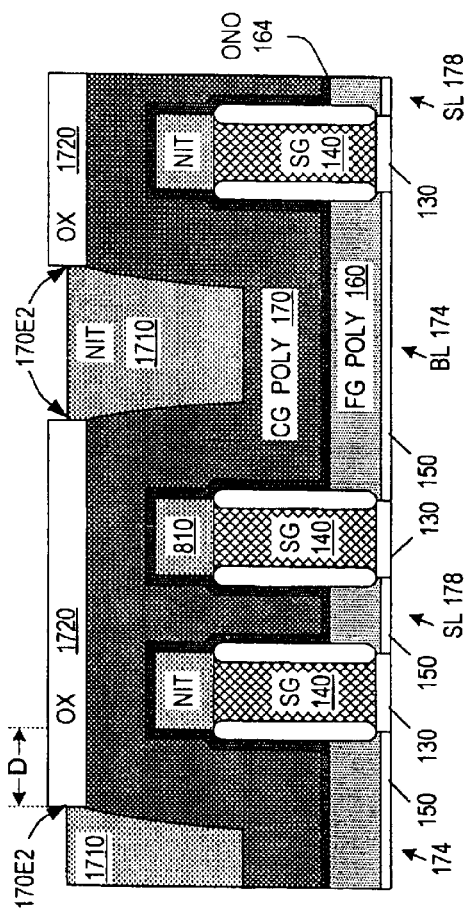
FIG. 15A (X1-X1')
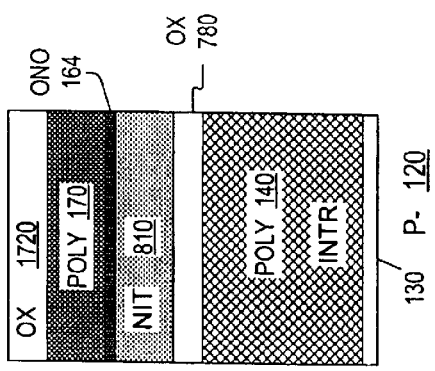
FIG. 15B (PERIPHERY)

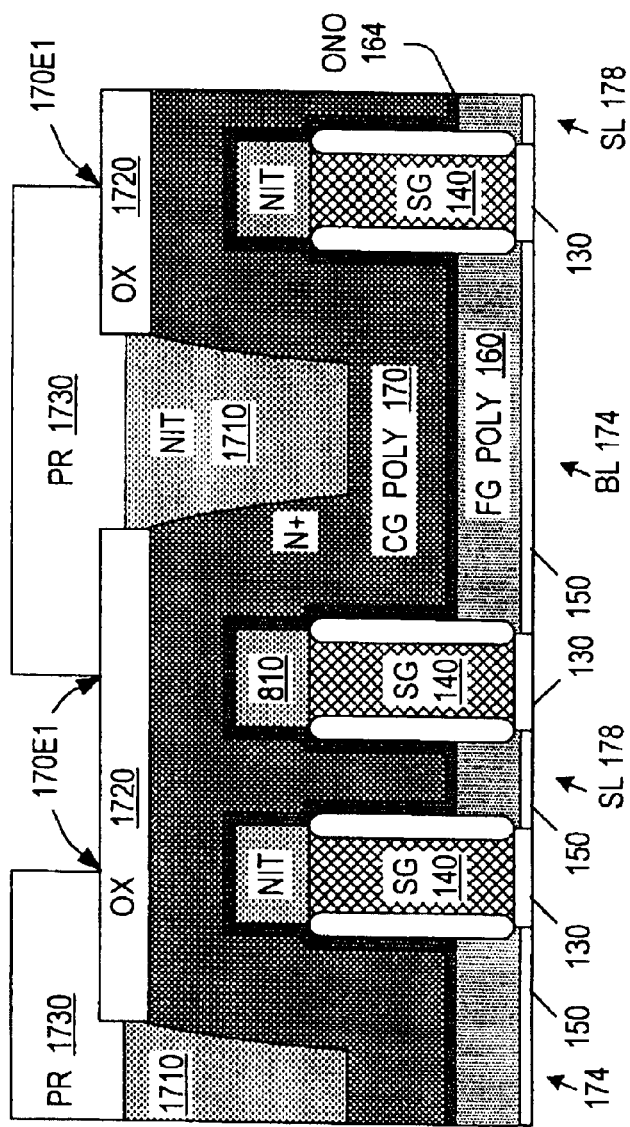
FIG. 16 (X1-X1')

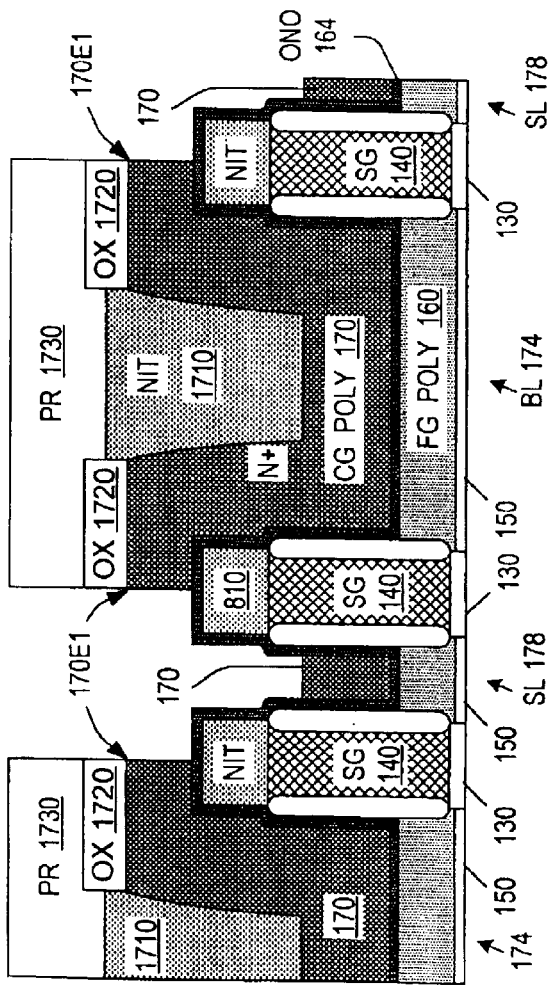
FIG. 17A (X1-X1')
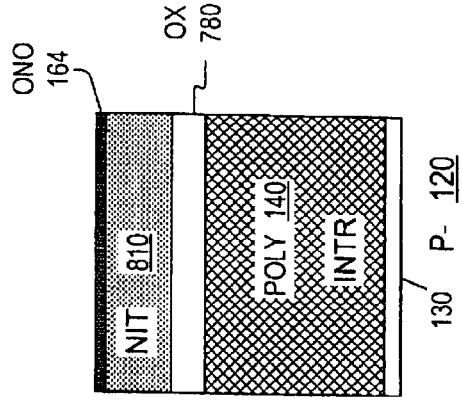
FIG. 17B (PERIPHERY)

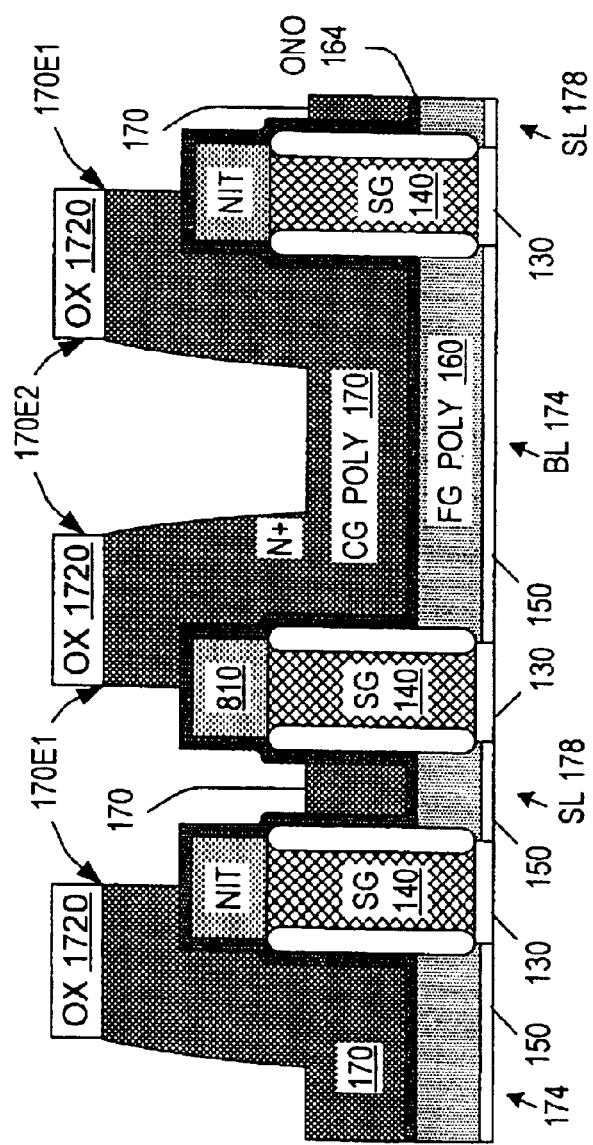
FIG. 18 (X1-X1')

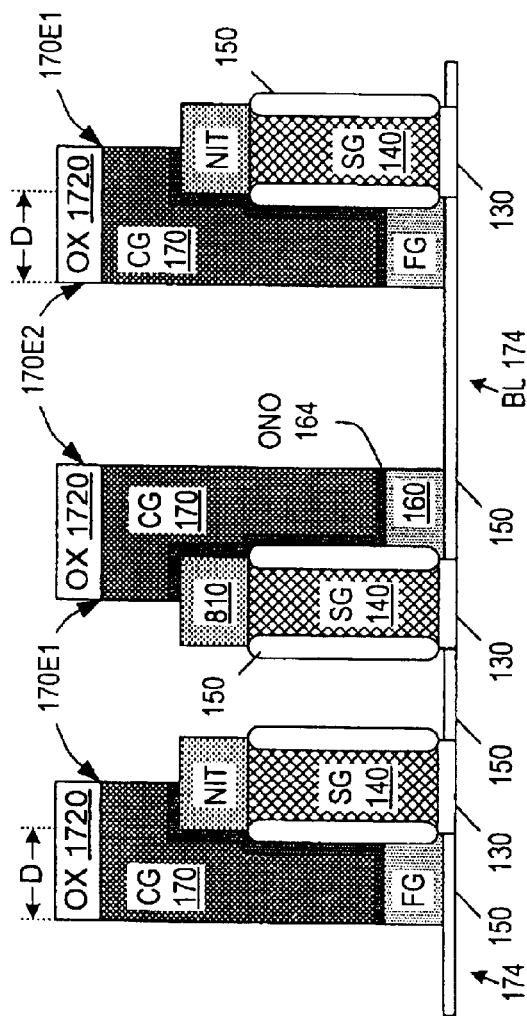
FIG. 19A (X1-X1')
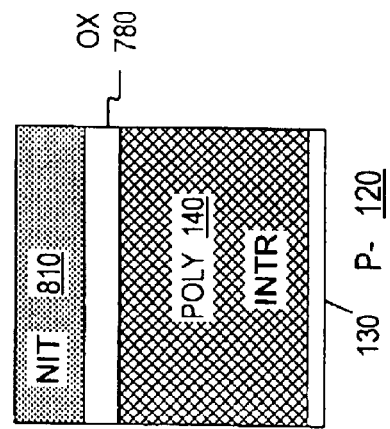
FIG. 19B (PERIPHERY)

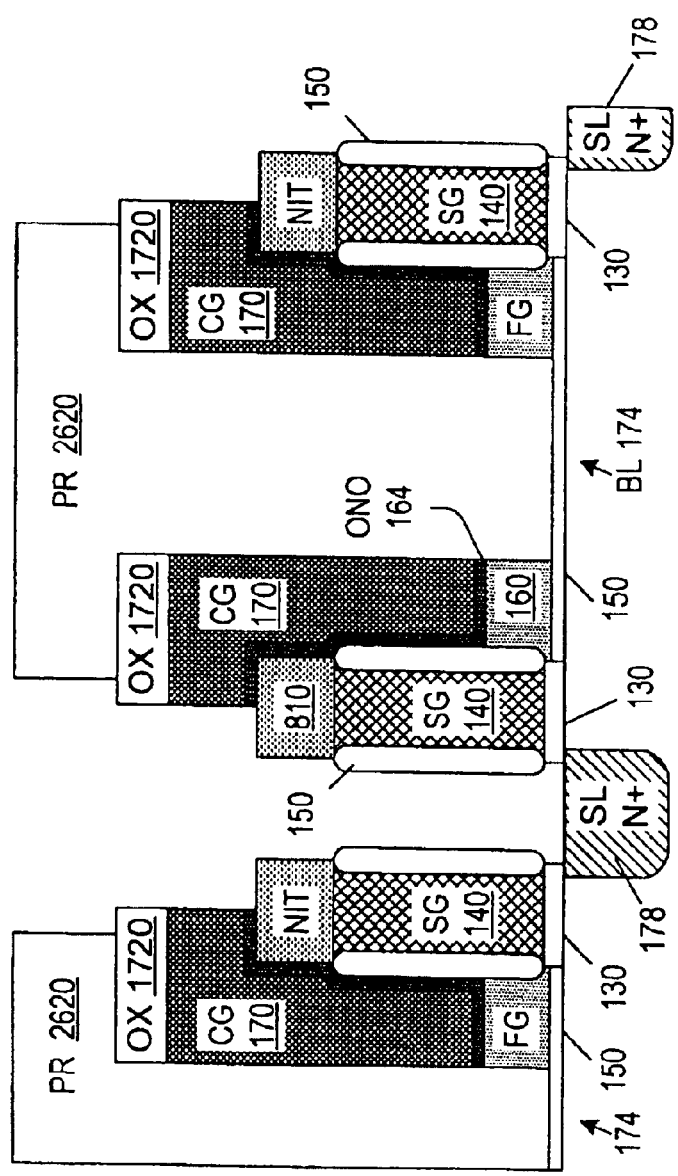
FIG. 20A (X1-X1')

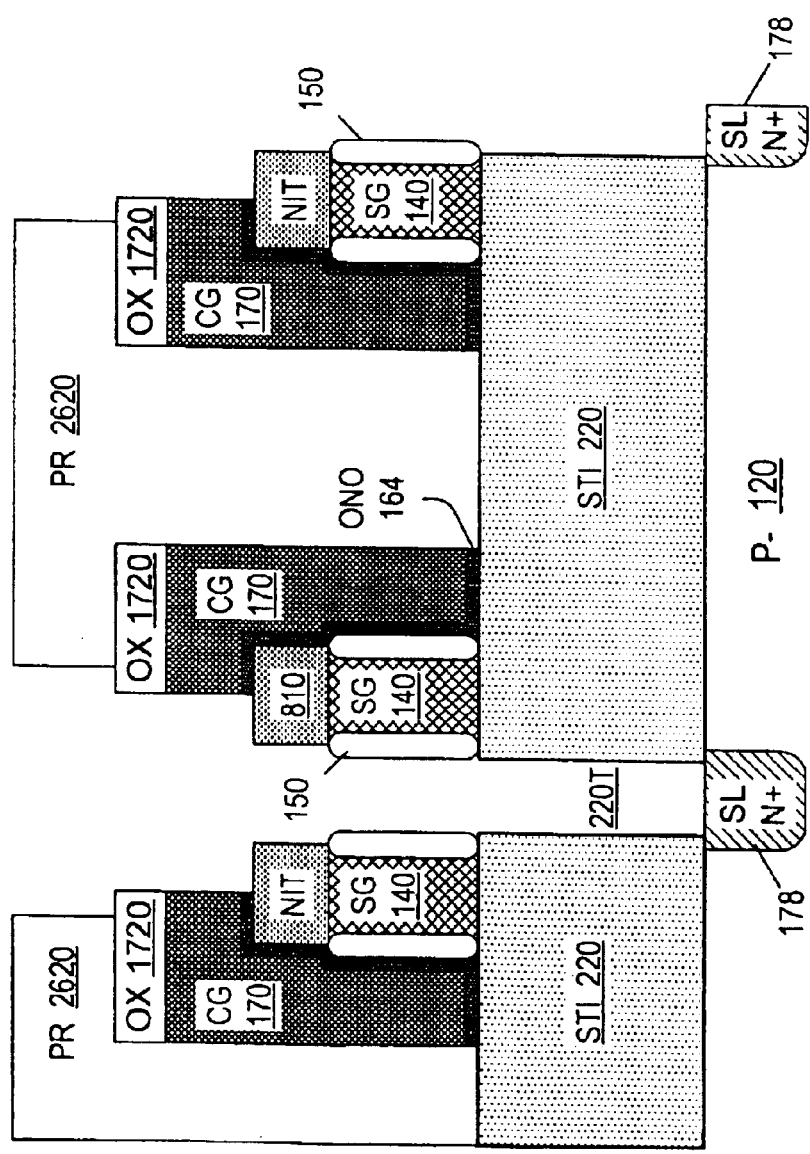

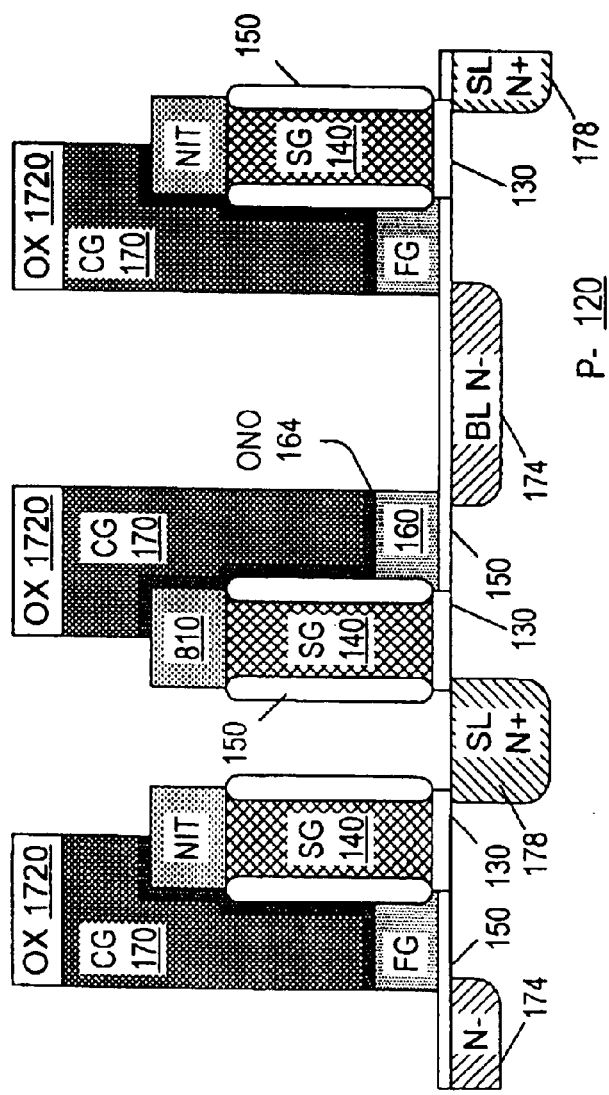
FIG. 21A (X1-X1')

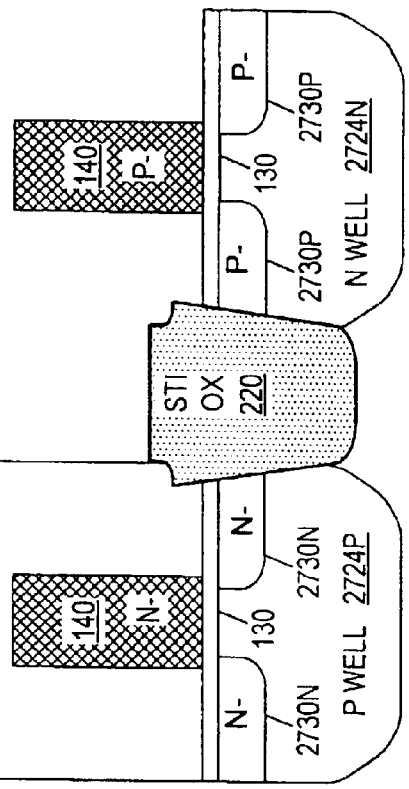
FIG. 21B (PERIPHERY)
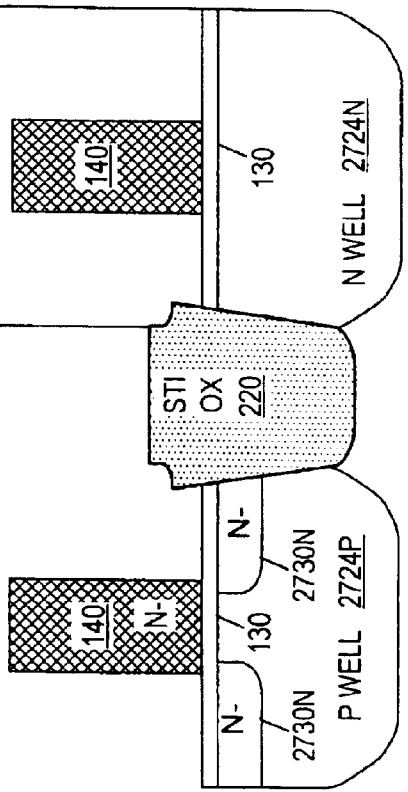
FIG. 22 (PERIPHERY)

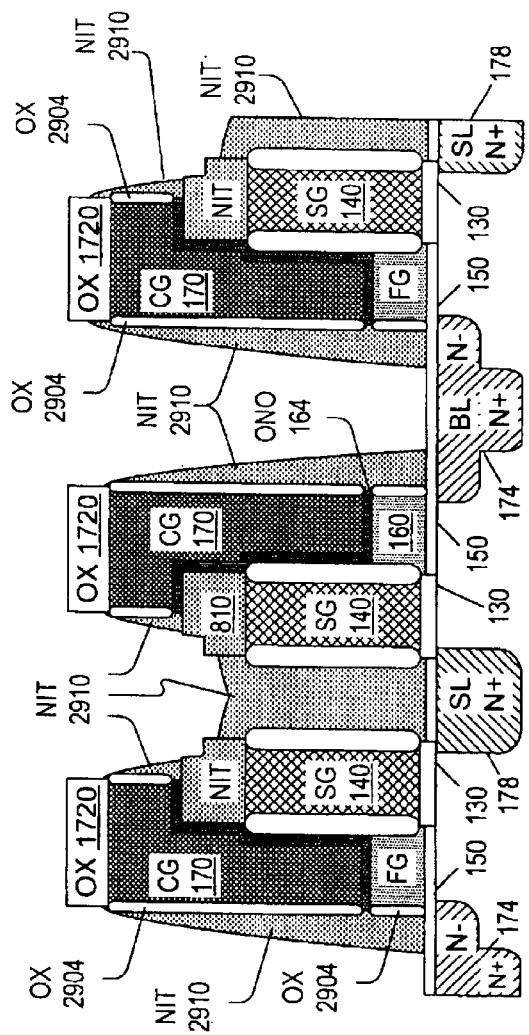
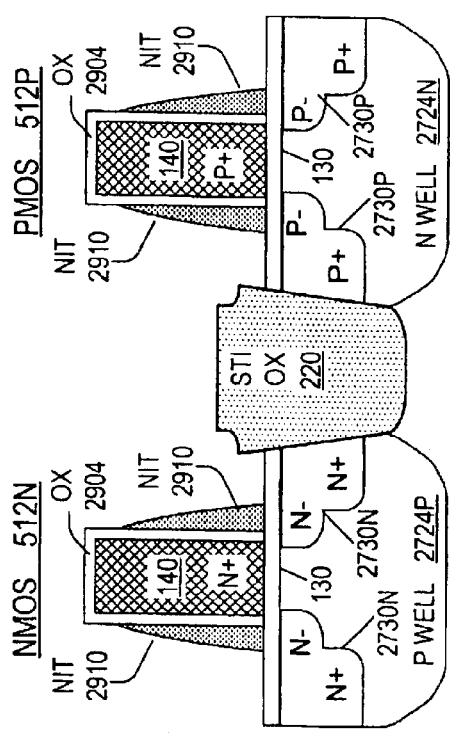
FIG. 23A (X1-X1')
FIG. 23B (PERIPHERY)

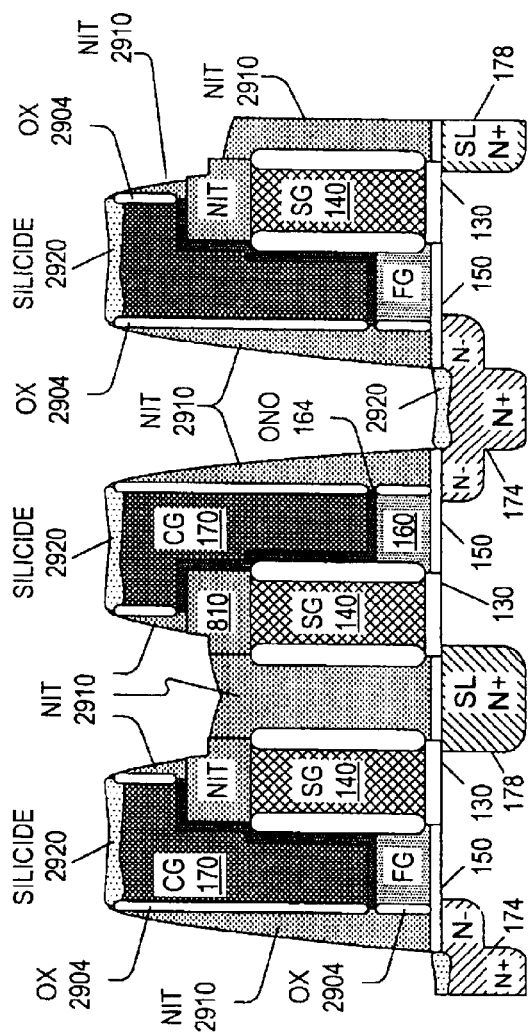
FIG. 24A (X1-X1')
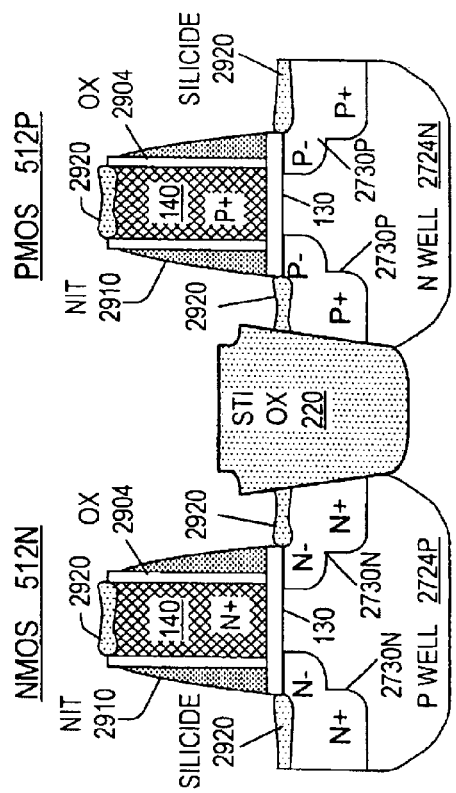
FIG. 24B (PERIPHERY)

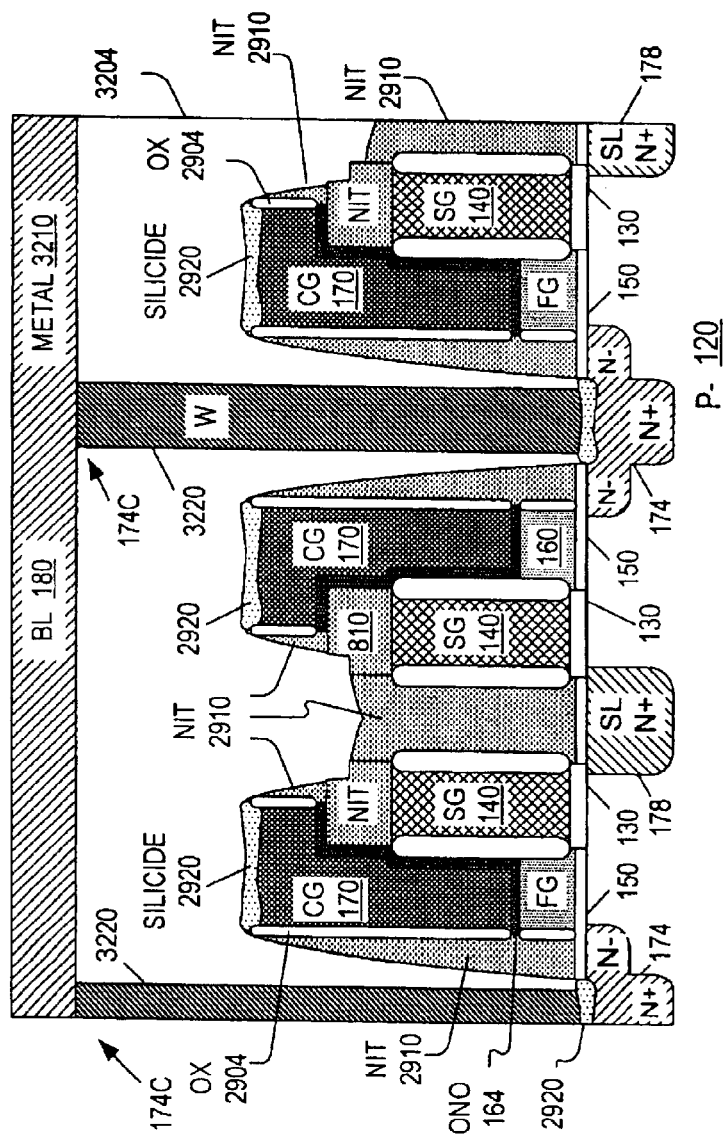
FIG. 25A (X1-X1')

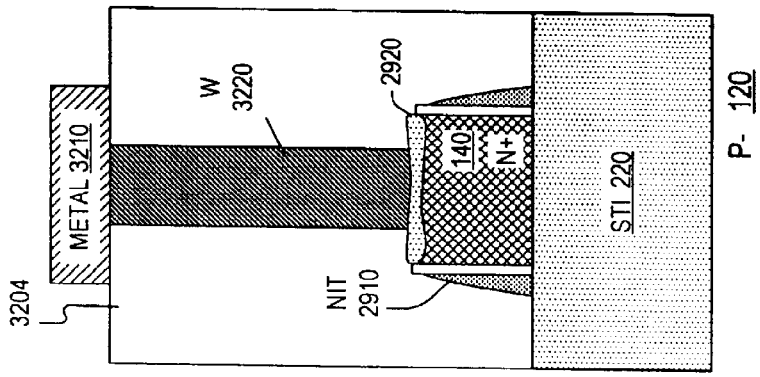
FIG. 25C (PERIPHERY)
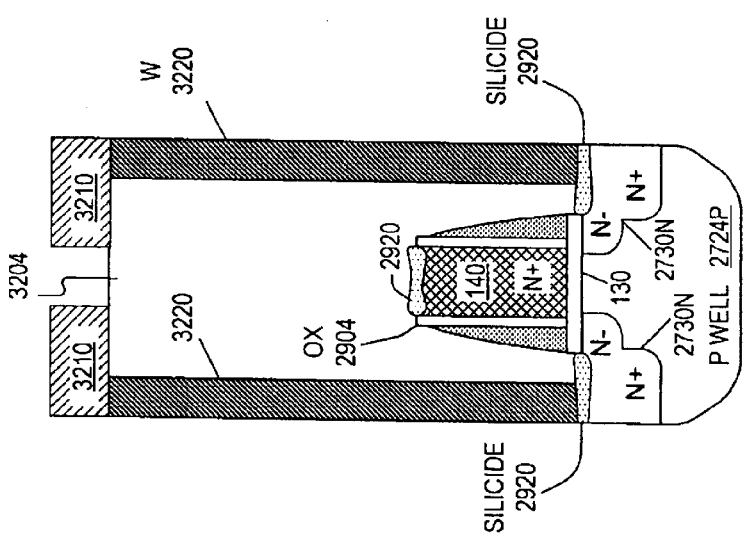
FIG. 25B (PERIPHERY)

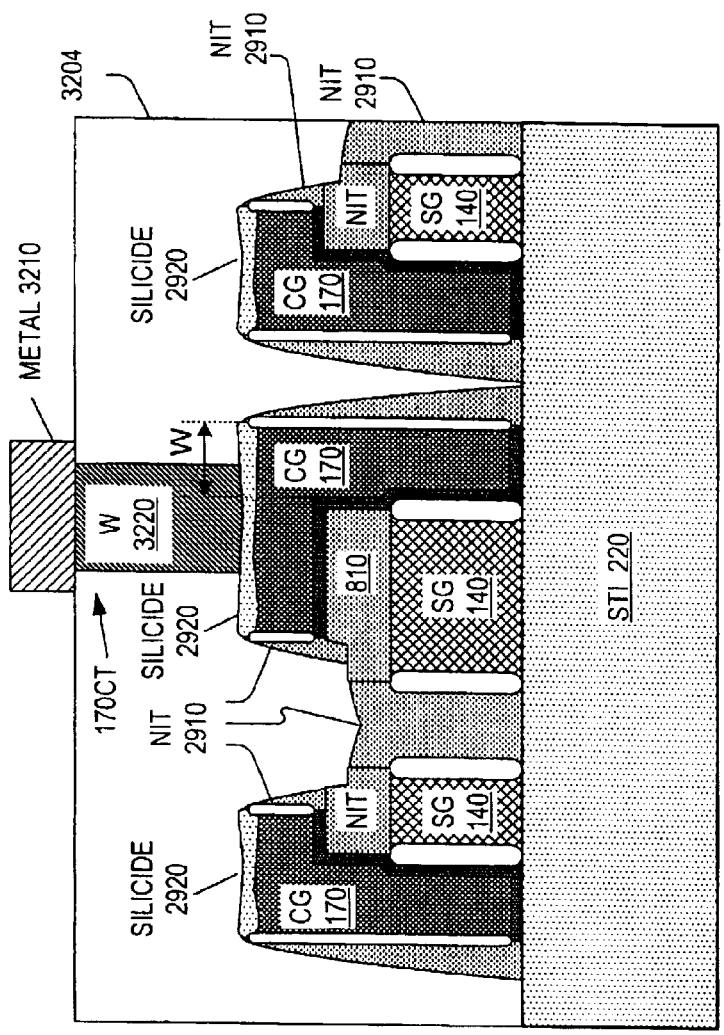
FIG. 25E (X3-X3')
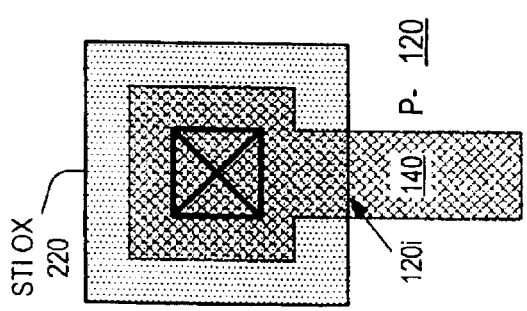
FIG. 25D (PERIPHERY)

US 6,844,586 B2

FABRICATION OF GATE DIELECTRIC IN NONVOLATILE MEMORIES HAVING SELECT, FLOATING AND CONTROL GATES

CROSS REFERENCE TO RELATED APPLICATIONS

The present application is a division of U.S. patent application Ser. No. 10/440,508 filed on May 16, 2003, incorporated herein by reference.

BACKGROUND OF THE INVENTION

The present invention relates to nonvolatile memories.

FIG. 1 illustrates a flash memory cell 110 described in U.S. Pat. No. 6,057,575 issued May 2, 2000 to Jenq. The cell is formed in and over a semiconductor substrate 120. Silicon dioxide 130 is thermally grown on substrate 120 to a thickness of 180 Å. Select gate 140 is formed on oxide 130. Silicon dioxide. 150 (100 Å) is thermally grown on a region of substrate 120 not covered by the select gate. ONO 154 (a sandwich of a layer of silicon dioxide, a layer of silicon nitride, and another layer of silicon dioxide) is formed on select gate 140. Floating gate 160 is formed on dielectric layers 150, 154. A portion of floating gate 160 overlies the select gate 140.

ONO layer 164 is formed on the floating and select gates. Control gate 170 is formed on ONO 164. The control gate overlies floating gate 160 and select gate 140.

N+ source and drain regions 174, 178 are formed in substrate 120.

FIG. 2 shows a circuit diagram of a memory array of cells 110. This is a NOR array. Each cell is shown schematically as a floating gate transistor and a select transistor connected in series. Select gate lines 140, control gate lines 170, and source lines 178 extend in the row direction (Y direction) throughout the array. Each select gate line 140 provides the select gates for one row of the array. Each control gate line 170 provides the control gates for one row. Each source line 178 is connected to source/drain regions 178 of two adjacent rows (here the same numeral 178 is used for the source lines and the source/drain regions). Bitlines 180 extend in the column direction (X direction). Each bitline 180 is connected to the regions 174 of two adjacent columns.

A cell 110 is programmed by hot electron injection from the cell's channel region (the P type region in substrate 120 below the cell's floating and select gates) to floating gate 160. The cell is erased by Fowler-Nordheim tunneling of electrons from floating gate 160 to source line region 178. The cell is read by sensing a current on the corresponding bitline region 174.

The memory includes peripheral circuitry (not shown) including decoders, sense amplifiers, high voltage generators, and other circuits used for the memory access. It is desirable to provide improved manufacturing techniques for fabricating the memory and the peripheral circuits.

SUMMARY

This section summarizes some features of the invention. Other features are described in the subsequent sections. The invention is defined by the appended claims which are incorporated into this section by reference.

In some embodiments of the present invention, one or more peripheral transistor gates are formed from the same layer as the select gate. The gate dielectric for these peripheral transistors and the gate dielectric for the select gates (such as dielectric 130 in FIG. 1) are formed simultaneously. Elimination of separate processing steps to form the gate dielectric for these peripheral transistors advantageously reduces the overall thermal processing involved in the memory fabrication.

In some embodiments, these peripheral transistors are high voltage transistors. High voltage transistors are transistors exposed to super high voltages. "Super high voltages" are voltages of a higher magnitude than the voltages provided to a memory cell in a read operation. For example, suppose the read voltages are all in the range from Vss to Vcc, where Vss is ground, and Vcc is a power supply voltage (received from an external power supply or generated internally) of 3.0V. Then a super high voltage is a voltage of a magnitude above 3.0V.

High voltage transistors may need a fairly thick gate dielectric. Select gates may also need a thick dielectric. In some embodiments, the memory is erased through the channel region. In the erase operation, the voltage between the substrate and the select gate is super high, so the select gate dielectric is made thick to sustain this voltage. The select gate dielectric matches the dielectric thickness of the high voltage transistors.

In some embodiments, the select gate dielectric is thicker than the dielectric underlying the floating gates (such as dielectric 150 in FIG. 1). In some embodiments, the memory includes peripheral transistors with different gate dielectric thicknesses, and the select gate dielectric is at least as thick as any peripheral transistor gate dielectric.

Other features and embodiments of the invention are described below. The invention is defined by the appended claims.

BRIEF DESCRIPTION OF THE DRAWINGS

FIGS. 4, 5A, 5B, 6A, 6B, 7A, 7B, 8, 9, 10, 11A, 11B, 12, 13A, 13B, 14, 15A, 15B, 16, 17A, 17B 18, 19A, 19B, 20A, 20B, 21A, 21B, 22, 23A, 23B, 24A–25C show vertical cross sections of integrated circuit structures according to embodiments of the present invention.

FIG. 25D is a top view of an integrated circuit structure according to an embodiment of the present invention.

FIG. 25E shows a vertical cross section of an integrated circuit structure according to an embodiment of the present invention.

DESCRIPTION OF SOME EMBODIMENTS

The embodiments described in this section illustrate but do not limit the invention. The invention is not limited to particular materials, processing steps, or dimensions. The invention is defined by the appended claims.

Figure 2:
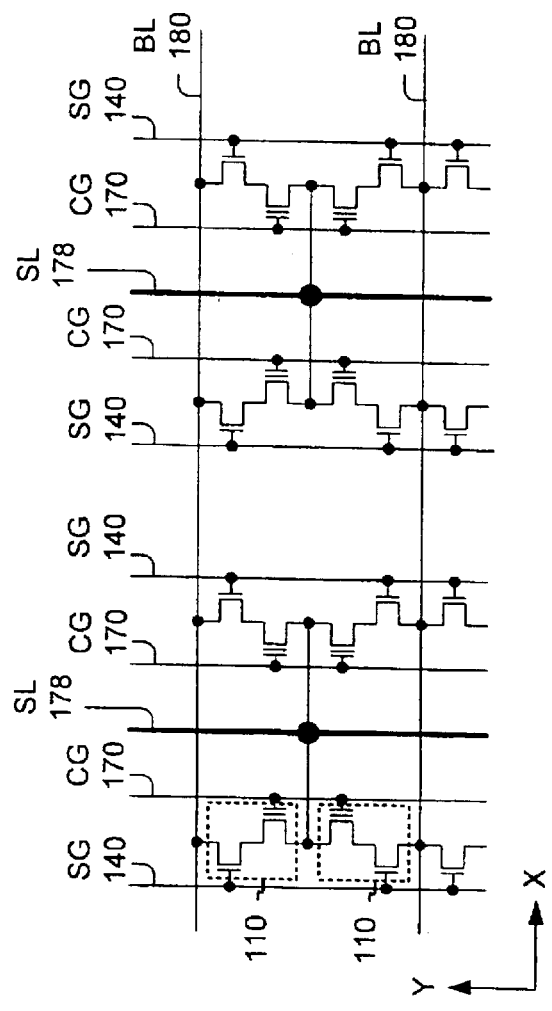
FIG. 2 is a circuit diagram of a prior art memory array.
Figure 3:
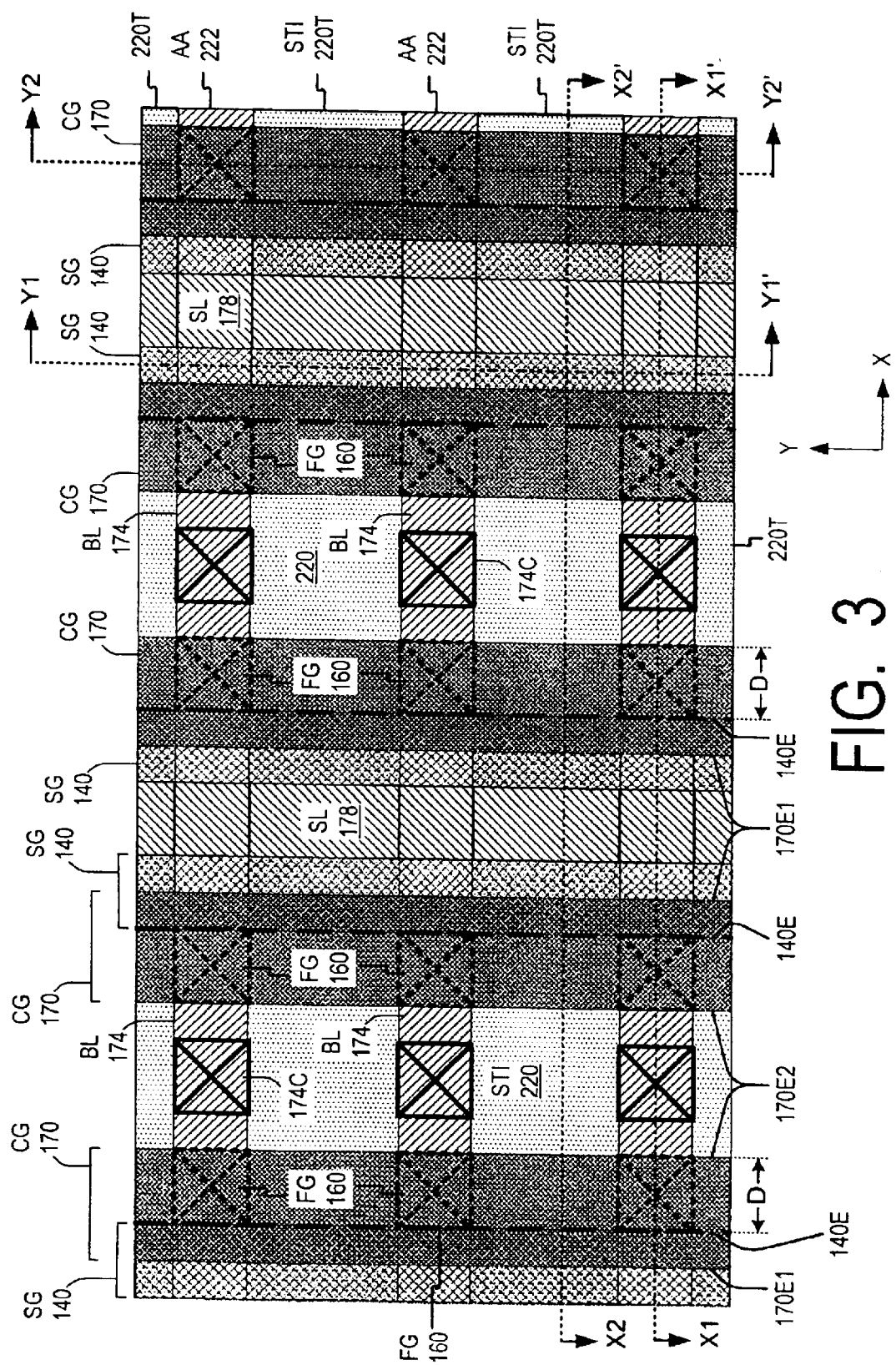
FIG. 3 is a top view of a memory array according to an embodiment of the present invention.

One memory embodiment of the present invention is shown in top view in FIG. 3. The memory circuit diagram is identical to that of FIG. 2. Select gate lines 140, control gate lines 170, and source lines 178 run through the memory array in the Y direction (row direction). The bitlines (not shown) run in the X direction (column direction). The bitlines contact the corresponding source/drain regions 174

("bitline regions") in areas 174C marked with a cross. Floating gates 160 are marked with dashed crosses. In this embodiment, the floating gates do not overlie the select gates. Control gate lines 170 overlap the select gates. Each dashed line 140E marks an edge of a select gate line 140 under a control gate line 170. Each control gate line 170 has an edge 170E1 overlying a select gate line 140, and another edge 170E2 which does not overlie the select gate line but runs at some distance D from the select gate line. The edges 170E2 and the distance D can be defined in a self-aligned manner as explained below. The edges 170E2 also define the edges of the floating gates 160 on the side of bitline regions 174. The floating gates can be completely self-aligned (i.e. defined independently of photolithographic alignment), as described below.

Figure 1:
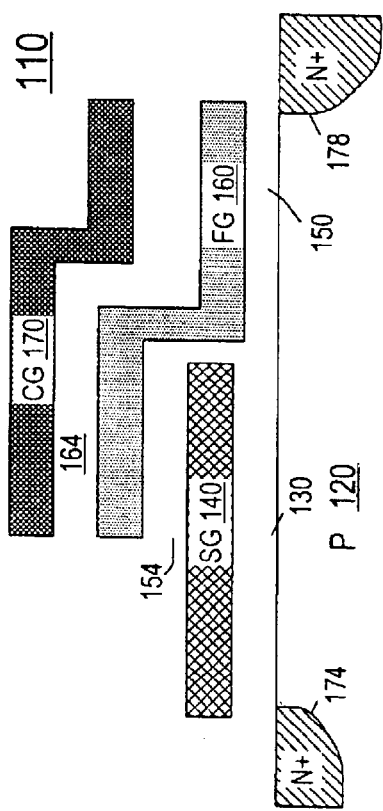
FIG. 1 shows a vertical cross section of a prior art flash memory cell.

In FIG. 3, floating gates 160 are adjacent to bitline regions 174, not to source line regions 178 as in FIG. 1. The increased distance between the floating gates and the source lines makes it possible to increase the source line doping concentration, and thus reduce the source line resistance, because the electrons are less likely to leak from the source lines to the floating gates. Further, in some embodiments, the memory cells are erased through the channel region. The exemplary voltages are given in Table 1 below. The voltage difference between the source line region 178 and select gate 140 is fairly low (at most about 6V in Table 1, for the erase operation). Therefore, the current leakage between source line 178 and select gate 140 is low. Further, the voltage difference between the source line 178 and the substrate 120 (P well 120 W) is at most a diode drop (during the erase operation), so the source line junction breakdown is unlikely. Consequently, the source line doping can be increased to reduce the sheet resistance. The invention is not limited to such embodiments however. For example, the floating gates can be adjacent to the source lines. The memory can be erased through source lines 178 or bitline regions 174.

Substrate isolation trenches 220T run through the array in the X direction. Trenches 220T are filled with dielectric 220, but dielectric 220 is etched out of the trenches at the location of source lines 178. Active areas 222 run through the array between the trenches 220T. Each active area 222 includes active areas of individual cells in one memory column. The active area of each cell consists of the cell's source/drain regions 174 and 178 and the P type channel region extending between the regions 174, 178. Numeral 178 denotes both a source line and a source/drain region ("source line region") of one memory cell.

Some of the figures below illustrate vertical cross sections of intermediate structures obtained during the memory fabrication. The sectional planes are indicated in FIG. 3 by lines X1–X1', X2–X2', Y1–Y1', and Y2–Y2'. The line X1–X1' runs in the X direction through an active area 222. The line X2–X2' runs in the X direction through a trench 220T. The line Y1–Y1' runs in the Y direction through a select gate line 140. The line Y2–Y2' runs in the Y direction through a control gate line 170 and floating gates 160.

In one embodiment, the memory is fabricated as follows. Substrate isolation regions 220 are formed in P doped substrate 120 by shallow trench isolation technology ("STI"). See FIG. 4 (cross section Y1–Y1'). Each region 220 is a dielectric region formed in a trench 220T. Suitable STI processes are described in U.S. Pat. No. 6,355,524 issued Mar. 12, 2002 to Tuan et al.; U.S. patent application Ser. No. 10/262,785 filed Oct. 1, 2002 by Yi Ding; and U.S. patent application Ser. No. 10/266,378 filed Oct. 7, 2002 by C. Hsiao, all incorporated herein by reference. Other STI and non-STI processes are also possible. We will sometime refer to dielectric 220 as "STI oxide" because it is silicon dioxide in some embodiments. The invention is not limited to such embodiments or to silicon integrated circuits.

Substrate isolation regions are also formed in the memory peripheral area (not shown in FIG. 4). The peripheral area contains circuitry needed to access the memory, and may also contain unrelated circuitry (the memory may be embedded into a larger system).

As shown in FIG. 4, oxide 220 protrudes above the substrate 120. The protruding portions are shown at 220 P. An exemplary thickness of portions 220P is 0.12 μm for a 0.18 μm fabrication process (a process with a 0.18 μm minimum line width). The exemplary dimensions given in this section assume a 0.18 μm fabrication process unless mentioned otherwise.

Dopant is implanted into substrate 120 to form an N type region 604 underlying the memory array. Dopant is also implanted into the substrate around the array to form a surrounding N type region (not shown) extending from the top surface of substrate 120 down to region 604. These implants create a fully isolated P well 120 W for the memory array. Region 604 is not shown in the subsequent drawings, and the P well 120 W is shown simply as substrate 120.

Silicon dioxide 130 (FIG. 5A, cross section Y1–Y1', and FIG. 5B, periphery) is thermally grown on the exposed areas of substrate 120 to provide gate dielectric for the select gates of the memory array and for the peripheral transistors. An exemplary thickness of oxide 130 in the array area is 120 Å. Generally, the oxide thickness depends on the maximum voltage that the oxide 130 is designed to sustain during the memory operation.

In the example shown in FIG. 5B, the peripheral area includes a high voltage transistor area 512H and a low voltage transistor area 512L. Oxide 130 is grown thermally to a thickness of 60 Å over the entire wafer. This oxide is removed from the low voltage area 512L by a masked etch. The wafer is re-oxidized to re-grow silicon dioxide in area 512L to a thickness of 60 Å. The oxide thickness in the memory array area and in high voltage area 512H increases from 60 Å to 120 Å during this step.

Thus, oxide 130 in the array area and oxide 130 in the high voltage peripheral area 512H is formed simultaneously in these two oxidation steps. The oxide 130 in area 512L and the oxide 130 in the array area and area 512H are not formed simultaneously because the oxide 130 in area 512L is formed in the second oxidation step.

As shown in FIG. 6A (cross section Y1–Y1') and FIG. 6B (periphery), intrinsic polysilicon layer 140 is formed over the structure by a conformal deposition process (e.g. low pressure chemical vapor deposition, "LPCVD"). Polysilicon 140 fills the spaces between the oxide protrusions 220P in the memory array area. The top polysilicon surface is planar because the polysilicon portions deposited on the sidewalls of protrusions 220P meet together.

FIG. 6B may represent either the low voltage or the high voltage transistor area. In some embodiments, there are more than two peripheral areas with different gate oxide thicknesses, and FIG. 6B may represent any of these areas.

Polysilicon 140 covers the regions 120*i* (FIG. 6B) at the interface between substrate 120 and field oxide 220 in the peripheral area. Polysilicon 140 will protect the oxide 220 in this area to prevent formation of grooves ("divots") during subsequent processing. Polysilicon 140 will be used to form the peripheral transistor gates. The grooving in regions 120*i* under the transistor gates is undesirable because it degrades the transistor characteristics.

Non-conformal deposition processes, whether known or to be invented, can also be used for layer 140. If the top surface of polysilicon 140 is not planar, it is believed that the polysilicon 140 can be planarized using known techniques (e.g. CMP, or spinning a photoresist layer over the polysilicon 140 and then simultaneously etching the resist and the polysilicon at equal etch rates until all of the photoresist is removed). The bottom surface of polysilicon 140 is non-planar as it goes up and down over the oxide protrusions 220P.

An exemplary final thickness of polysilicon 140 is 0.16 $\mu$m over the active areas.

Silicon dioxide layer 780 (FIG. 6B) is formed over the wafer, by TEOS CVD for example, to a thickness of 400–500 Å. This layer will serve as an etch stop in a silicon nitride etch. Optionally, oxide 780 is removed from the array area by a masked etch.

The peripheral area is masked, and polysilicon 140 is doped N+ in the array area. Polysilicon 140 remains undoped ("INTR", i.e. intrinsic) in the periphery. The peripheral transistor gates will be doped later, with the NMOS gates doped N+ and the PMOS gates P+, to fabricate surface channel transistors in the periphery with appropriate threshold voltages. The invention is not limited to the surface channel transistors or any peripheral processing. In particular, entire polysilicon 140 can be doped N+or P+after the deposition or in situ.

Silicon nitride 810 is deposited on polysilicon 140, by LPCVD for example, to an exemplary thickness of 1500 Å. If desired, a pad oxide layer (not shown) can be formed on polysilicon 140 before the nitride deposition. The pad oxide layer will provide an additional protection for the select gates during the patterning of control gate polysilicon 170 described below.

In some embodiments, the top surface of polysilicon 140 and/or nitride 810 is not planar.

The wafer is coated with a photoresist layer 820. See FIG. 7A, cross section X1–X1', and FIG. 7B, periphery. (FIG. 7B shows only the active area, not the field oxide 220.) Resist 820 is patterned to define the select gate lines 140. The peripheral area is covered by the resist. Edges 140E of select gate lines 140 are adjacent to the future positions of source lines 178. The memory array geometry is not sensitive to a misalignment between mask 820 and the mask defining the isolation trenches 220T (FIG. 3) except possibly at the boundary of the memory array.

Silicon nitride 810 is etched through the resist openings. The resist is removed, and polysilicon 140 is etched away where exposed by nitride 810. Then the exposed oxide 130 is removed. The select gate lines are formed as a result. (In an alternative embodiment, the resist defining the nitride 810 is removed after the etch of polysilicon 140 and/or oxide 130.)

Figure 8:
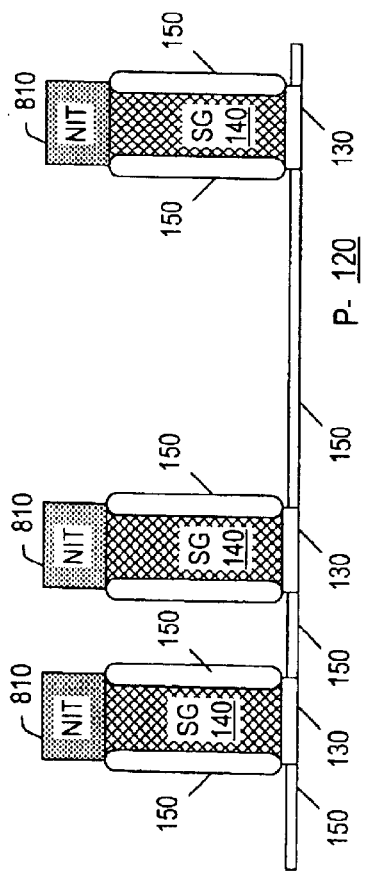

As shown in FIG. 8 (cross section X1–X1'), the structure is oxidized to grow silicon dioxide 150 on substrate 120 and the sidewalls of polysilicon gates 140 in the array area. Oxide 150 will serve as tunnel oxide on substrate 120, and will provide sidewall insulation for the select gates. The oxide thickness depends on the dopants and dopant concentrations. In one embodiment, oxide 150 is 90 Å thick on substrate 120, and is 300 Å thick on the select gate sidewalls. The peripheral area is covered by nitride 810 (FIG. 6B), and remains substantially unchanged during this step.

Figure 9:
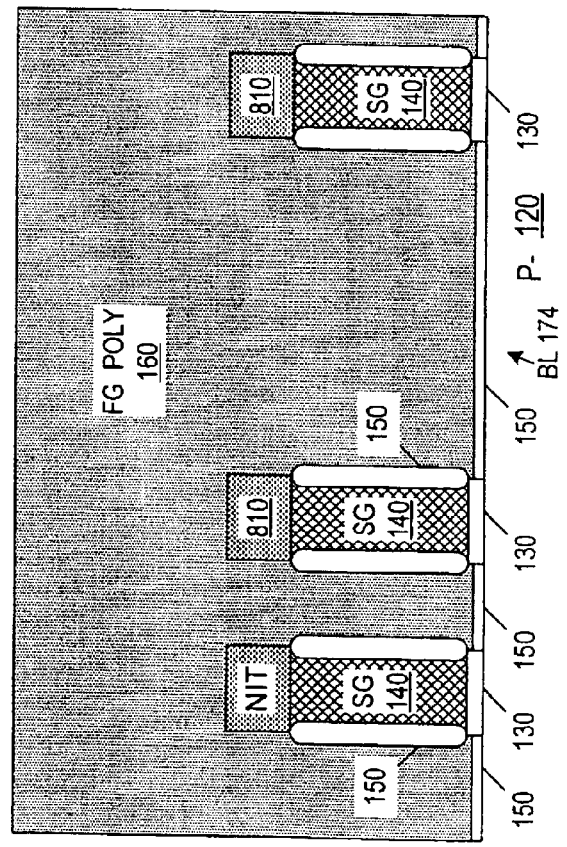

Floating gate polysilicon 160 (FIG. 9, cross section X1–X1') is deposited over the structure, by LPCVD for example, and is doped during or after the deposition. Polysilicon 160 is sufficiently thick to ensure that its top surface is at least as high throughout the wafer as the top surface of nitride 810. In the embodiment of FIG. 9, the top surface of layer 160 is planar due to a conformal deposition to a thickness larger than half the distance between the adjacent select gate lines 140. In one embodiment, the distance between select gate lines 140 over the future positions of bitline regions 174 is 0.8 $\mu$m, and the polysilicon 160 is more than 0.4 $\mu$m thick.

If the top surface of polysilicon 160 is not planar, it is planarized by CMP or a suitable etch.

After planarization (if needed), layer 160 is etched down without a mask. The etch end point is when STI oxide 220 becomes exposed. FIG. 10 (cross section X1–X1') shows an intermediate stage in this etch, when nitride 810 becomes exposed. At this stage, layer 160 has been removed from the periphery, so the periphery becomes as in FIG. 6B.

FIGS. 11A (cross section X1–X1') and 11B (cross section Y2–Y2') show the array area at the end of the polysilicon etch. The polysilicon has been removed from the top surface of oxide 220. In some embodiments, the final thickness of layer 160 is 1200 Å. The etch is selective to nitride 810.

Optionally, a timed etch of oxide 220 is performed to recess the top surface of oxide 220 below the surface of polysilicon 160. See FIG. 12 (cross section Y2–Y2'). This etch will improve the capacitive coupling between the floating and control gates. See the aforementioned U.S. Pat. No. 6,355,524. In the embodiment of FIG. 12, the oxide 220 continues to protrude above the top surface of substrate 120 by at least 0.10 $\mu$m. In other embodiments, the oxide 220 does not protrude above the substrate after the etch (tile top surface of layer 220 is level with the top surface of the substrate after the oxide etch).

ONO layer 164 (FIG. 13A, cross section X1–X1', and FIG. 13B, periphery) is formed over the structure. Control gate polysilicon layer 170 is deposited on ONO 164 and is doped during or after the deposition.

The top surface of polysilicon 170 is not planar in the array area. Layer 170 has protrusions 170.1 over the select gate lines 140. Cavities 170C form in layer 170 between protrusions 170.1 over the future positions of bitline regions 174. The protrusions 170.1 will be used to define the overlap between the floating and control gates without additional dependence on photolithographic alignment.

In FIG. 13A, polysilicon 170 is substantially planar over the future positions of source lines 178 because the source lines 178 are fairly narrow (0.22 $\mu$m width in some embodiments) and layer 170 is relatively thick (e.g. 0.18 $\mu$m). In other embodiments, the layer 170 is not planar over the source lines 178, and a cavity 170C forms over each source line. The topography of layer 170 depends on the underlying topography, the thickness of polysilicon 170, and the polysilicon deposition process.

Figure 14:
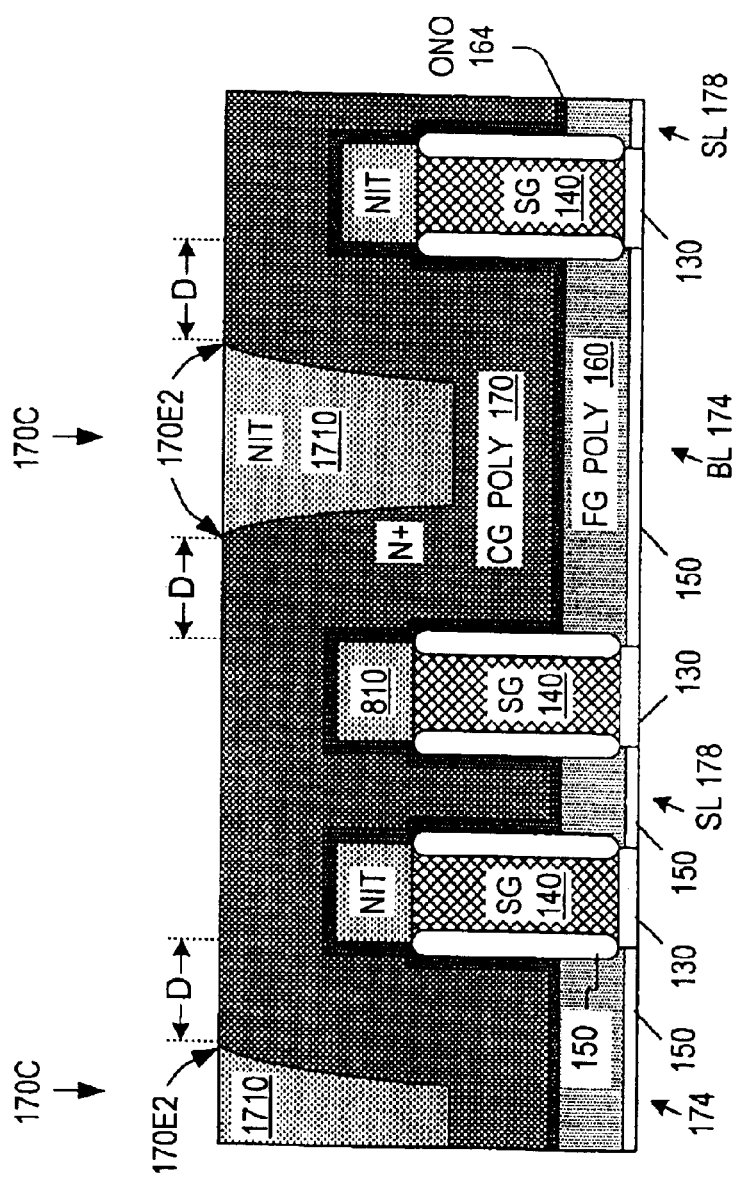

As shown in FIGS. 14 (cross section X1–X1'), a layer 1710 is deposited over the structure and etched without a mask to expose the polysilicon 170. Layer 1710 fills the cavities 170C. When layer 1710 is etched in the array area, layer 1710 is removed in the periphery, so the periphery becomes as in FIG. 13B. In one embodiment, layer 1710 is silicon nitride deposited to have a planar top surface or planarized during the etch.

In some embodiments, the etch of nitride 1710 continues after the exposure of polysilicon 170, and the nitride etch exposes the sidewalls of polysilicon protrusions 170.1 (FIG. 13A). Whether or not the polysilicon sidewalls are exposed, the exposed edges of polysilicon 170 define the control gate edges 170E2 (FIG. 3) as described below. Therefore, the edges 170E2 and the distance D are defined without resort to photolithography. In some embodiments, D=0.18 μm. The overlap between the floating and control gates is also defined without photolithography.

The wafer is oxidized to grow silicon dioxide 1720 on the exposed polysilicon 170. See FIG. 15A (cross section X1–X1') and FIG. 15B (periphery). An exemplary thickness of oxide 1720 is 500 Å.

In some embodiments, layer 1720 is some other material formed selectively on polysilicon 170. For example, layer 1720 can be a conductive metal silicide formed by a salicide (self-aligned silicidation) technique.

The wafer is coated with photoresist 1730 (FIG. 16, cross section X1–X1'). Openings are formed in the resist over the future positions of source lines 178. The location of the longitudinal edges of mask 1730 is the location of the future positions of control gate edges 170E1 (see also FIG. 3). These edges can be located anywhere over select gate lines 140. The resist is removed from the peripheral area.

Oxide 1720 and at least a portion of polysilicon 170 are removed where exposed by resist 1730. See FIG. 17A, cross section X1–X1', and FIG. 17B, periphery. The etch of polysilicon 170 may stop when ONO 164 is exposed, or may continue after the exposure of ONO 164. In either case, polysilicon 170 is etched away in the periphery. When ONO 164 is exposed, the etch may continue for a predetermined time (a timed etch), or may continue until all of the exposed polysilicon 170 is removed. In one embodiment, the polysilicon etch is a timed etch reducing the thickness of polysilicon 170 over the source lines to about 0.18 μm.

Resist 1730 and nitride 1710 are removed. The resulting structure is shown in FIGS. 18 (cross section X1–X1'). The periphery remains as in FIG. 17B.

Polysilicon 170, ONO 164, and polysilicon 160 are etched with oxide 1720 as a mask. The resulting structure is shown in FIG. 19A (cross section X1–X1') and FIG. 19B (periphery). In some embodiments, the polysilicon etch of layers 170, 160 is anisotropic, and the etch of ONO 164 is isotropic or anisotropic. The etch of ONO 164 may remove portions of oxide 1720 and/or nitride 810, and may also remove some oxide 150 on the sidewalls of select gate lines 140.

The wafer is coated with photoresist 2620 (FIG. 20A, cross section X1–X1'). The resist is patterned to expose the source lines 178. Each source line 178 traverses the memory array between two adjacent control gate lines 170, and provides one source/drain region to each cell in the two rows associated with the two control gate lines. The edges of the resist openings can be positioned anywhere over select gate lines 140 or floating gates 160. The periphery is covered by the resist.

Silicon dioxide 220 is etched out of trenches 220T in the areas exposed by resist mask 2620 (FIG. 20B, cross section X2–X2'). This etch removes oxide 150 in the active areas over the source lines (FIG. 20A). This etch may also remove the exposed portions oxide 1720 if oxide 1720 is not entirely covered by the resist. Then the source line implant (N+) is performed using the same mask. In some embodiments, this is a high energy, high dose implant, possibly preceded by a lower energy, low dose, large angled implant (the angle can be 10° to 30° for example), to achieve a 0.1 μm to 0.2 μm source line diffusion depth.

In an alternative embodiment, when the resist mask 2620 has been formed, a high energy N+ implant is performed before the etch of oxide 220, then oxide 220 is etched out of the trenches using the same mask, and then another, lower energy N type implant is performed using the same mask. The first (high energy) implant is at least partially blocked by oxide 220 in the trenches to avoid shorting the source lines 178 to N type isolation region 604 (FIG. 4). See the aforementioned U.S. Pat. No. 6,355,524.

Resist 2620 is removed. Another photoresist layer (not shown) is formed over the wafer and patterned to cover the array but expose the entire periphery. Then nitride 810 (FIG. 19B) is etched away from the peripheral area. Oxide 780 serves as an etch stop during the nitride etch. Then oxide 780 is removed.

The resist covering the array is removed, and another photoresist layer (not shown) is formed to cover the array and define the peripheral transistor gates. Polysilicon 140 is etched away where exposed by this resist.

The resist is removed. The wafer is coated with a photoresist layer 2720 (FIG. 21B, periphery). The resist is patterned to expose the entire array area (FIG. 21A, cross section X1–X1') and also to expose the peripheral NMOS transistor regions. FIG. 21B shows a peripheral NMOS transistor region 512N with a P well 2724P, and a peripheral PMOS transistor region 512P with an N well 2724N. These wells were defined before formation of oxide 130. There can be many regions 512N, 512P in the integrated circuit. Resist 2720 covers the PMOS transistor regions 512P. An N type implant (N–) is performed to form the LDD (lightly doped drain) extensions for peripheral NMOS source/drain regions 273 ON (FIG. 21B). This implant also dopes the NMOS gates 140 in the periphery. In addition, the implant dopes bitline regions 174 (FIG. 21A) and increases the dopant concentration in source lines 178.

In some embodiments, the memory array is not exposed by resist 2720, and no doping is performed in the source lines and the bitline regions at this step.

Resist 2720 is removed, and another photoresist layer 2820 (FIG. 22, periphery) is formed to cover the NMOS peripheral transistor regions 512N and the memory array. A P type implant (P–) is performed to form the LDD extensions for PMOS source/drain regions 2730P and to dope the peripheral PMOS transistor gates.

Resist 2820 is removed. A thin silicon dioxide layer 2904 (see FIG. 23A, cross section X1–X1', and FIG. 23B, periphery) is grown on the exposed silicon surfaces of layers 140, 160, 170 by a rapid thermal oxidation process (RTO). Alternative techniques can also be used such as chemical vapor deposition (e.g. TEOS CVD), a high temperature oxide process (HTO), or other suitable techniques, known or to be invented. These techniques may form the oxide 2904 over the entire structure and not only on the silicon surfaces. An exemplary thickness of oxide 2904 is 100 Å.

A thin silicon nitride layer 2910 is deposited and etched anisotropically without a mask to form sidewall spacers over the gate structures. The etch of nitride 2910 may remove some of nitride 810 in the array area (FIG. 23A). If oxide 2904 was deposited over the entire structure (by TEOS CVD or HTO for example), oxide 2904 will help protect the substrate 120 during the nitride etch. Spacers 2910 meet over the source lines 178 and create a thick nitride layer over the source lines. In other embodiments, the spacers do not meet over the source lines.

Then N+ and P+ implants are performed to create source/drain structures for the peripheral transistors and the bitline regions 174. More particularly, the peripheral PMOS transistor area 512P is masked with resist (not shown), and an N+ implant is performed to create the source/drain structures for bitline regions 174 and the peripheral NMOS transistors and increase the dopant concentration in the peripheral NMOS gates 140. The floating, control and select gates and the overlying nitride layers mask this implant so no additional masking in the array area is needed.

The resist is removed. The array and the peripheral NMOS transistor regions 512N are masked with a resist (not shown), and a P+ implant is performed to create the source/drain structures for the peripheral PMOS transistors and increases the dopant concentration in the PMOS transistor gates 140.

The resist is removed. A silicon dioxide etch is performed to remove the oxide 1720 and expose the control gate lines 170 (FIG. 24A, cross section X1–X1'). This etch also removes the exposed portions of oxide 150 over bitline regions 174 in the array area, the exposed oxide 130 over source/drain regions 2730N, 2730P in the periphery (see FIG. 24B), and the oxide 2904 over the peripheral transistor gates.

A conductive metal silicide layer 2920 is formed by a self-aligned silicidation (salicide) process on the exposed silicon surfaces of control gate lines 170, bitline regions 174, peripheral transistor gates 140 and peripheral source/drain regions 2730N, 2730P. The salicide process involves depositing a metal layer, heating the structure to react the metal with the silicon, and removing the unreacted metal. This can be followed by an anneal or any other suitable processing, known or to be invented, to improve the silicide properties (e.g. increase its conductivity). Titanium, cobalt, nickel, and other conductive materials, known or to be invented, can be used for the metal layer. Non-salicide selective deposition techniques, known or to be invented, that selectively form a conductive layer 2920 on the exposed silicon but not on a non-silicon surface, can also be used.

As noted above in connection with FIG. 15, layer 1720 can be a conductive metal silicide formed by a salicide process. In this case, layer 1720 does not have to be removed. The silicidation process of FIG. 24A will silicide the bitline regions 174, the peripheral gates 140 and the peripheral source/drain regions 2730.

Figure 25F:
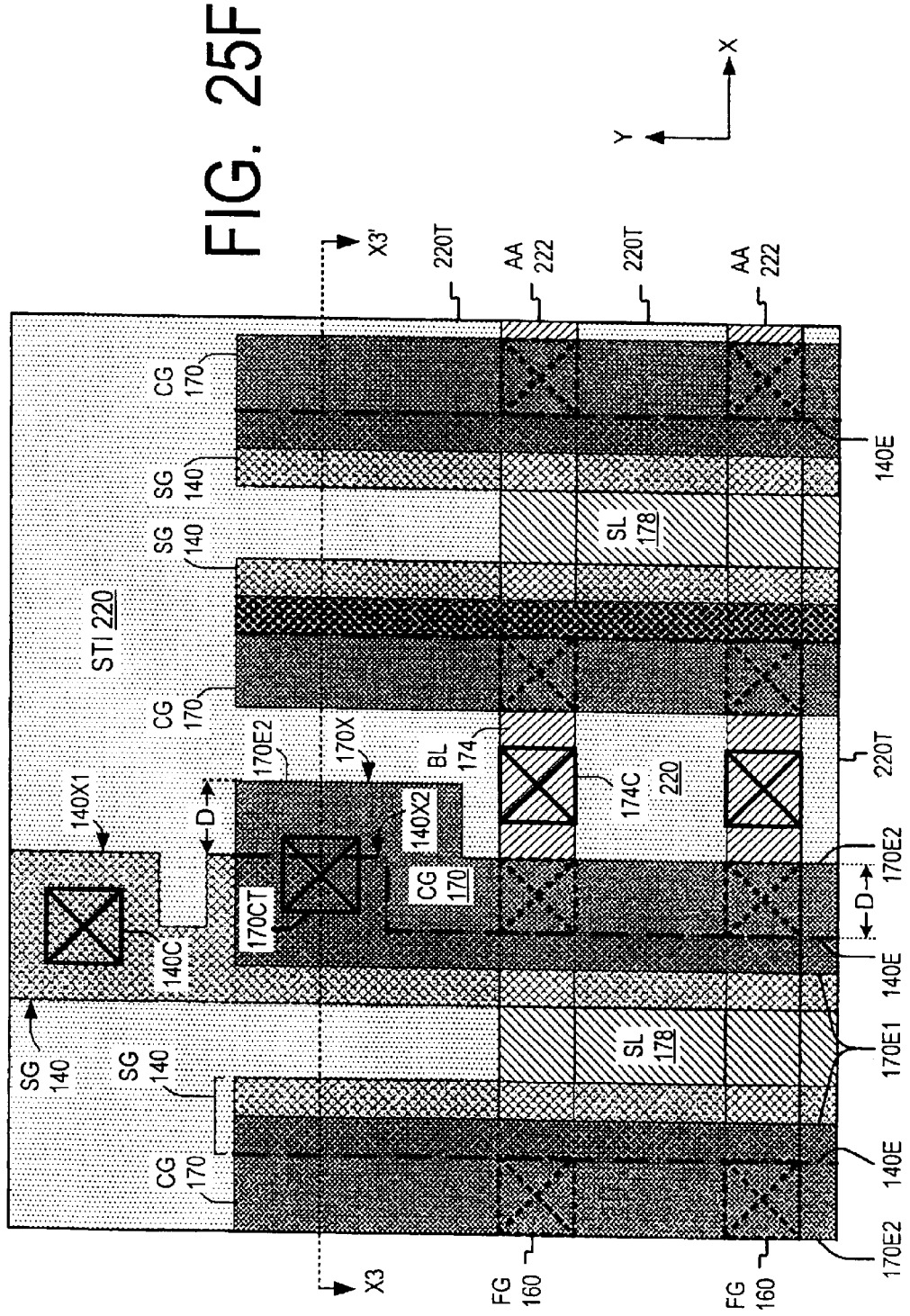
FIG. 25F is a top view of an integrated circuit structure according to an embodiment of the present invention.

As shown in FIG. 25A (cross section X1–X1') and FIGS. 25B and 25C (periphery), inter-level dielectric 3204 is deposited over the wafer. FIG. 25C shows only an NMOS transistor region, but the PMOS regions are similar. See also FIG. 25E showing an array cross section X3–X3' described below in connection with FIG. 25F. Contact openings are etched in dielectric 3204 to expose the silicided surfaces of bitline regions 174 (FIG. 25A), source/drain regions 2730P and 2730N (FIG. 25B), peripheral gates 140 (FIG. 25C), and control gates 170 (FIG. 25E). The silicide 2920 protects the bitline regions 174 and the source/drain regions 2730 during this etch. A conductive layer 3210 (e.g. metal) is deposited and patterned to form the bitlines 180 and possibly other features. The figures also show an optional metal layer 3220 (e.g. tungsten) used to fill the contact openings before the deposition of layer 3210.

FIG. 25D (top view) shows an extension of a peripheral transistor gate 140 over STI oxide 220. The extension can be made to form a contact to the gate or for some other reason (e.g. to connect the gate to other features). The region 120i at the interface between the substrate 120 and field oxide 220 is protected from the divot formation because the gate is formed using the first polysilicon layer 140. See also FIG. 6B. The transistor of FIG. 25D can be a high voltage transistor (in area 512H in FIG. 5B) or a low voltage transistor (in area 512L).

FIGS. 25E, 25F illustrate the boundary of the memory array. Contacts to control gate lines 170 and select gate lines 140 are formed in this area. FIG. 25F is a top view, and FIG. 25E illustrates a vertical cross section along the line X3–X3' in FIG. 25F. The line X3–X3' passes through control gate contact opening 170CT formed in dielectric 3204. Control gate contact opening 170CT and select gate contact opening 140C are formed over STI oxide 220. Control gate line 170 has a widened portion 170X to accommodate the contact opening 170CT. Select gate line 140 has a widened portion 140X1 to accommodate the select gate contact opening 140C.

Select gate line 140 has another widened portion 140X2 under the widened portion 170X of the control gate line. The portion 170X is created in a self-aligned manner by the widened portion 140X2. As shown in FIGS. 3, 14, and 19A, the control gate edge 170E2 follows the select gate edge 140E at the distance D from the select gate. The distance D is defined without photolithography as explained above. The select gate edges are defined by mask 820 (FIG. 7A). The select gate edges are straight edges in this embodiment, but in the area shown in FIG. 25F the edge 140E deviates from the straight line to widen the select gate to form the region 140X2. Consequently, the control gate edge 170E2 deviates from the straight line to form the widened region 170X in a self-aligned manner.

Other details of the memory fabrication process for one embodiment are given in U.S. patent application Ser. No. 10/393,212 "NONVOLATILE MEMORIES AND METHODS OF FABRICATION" filed Mar. 19, 2003 by Yi Ding and incorporated herein by reference.

In one embodiment, the memory cells 110 are programmed by channel hot electron injection. The corresponding select gate 140 is held at a voltage sufficiently high to invert the underlying portion of the cell's channel region. Control gate 170 is driven high relative to substrate 120 to raise the voltage on floating gate 160 relative to the channel region and invert the channel region under the floating gate. A voltage difference is provided between the source/drain regions 174, 178 to induce a current and cause the hot electron injection from the channel region into the floating gate. The cells are erased by Fowler-Nordheim tunneling through the channel regions ("bulk erase"). The cells are read by sensing a current on bitlines 180 when the select gate 140 is at a high enough voltage to invert the underlying portion of the channel region, the control gate 170 is at an appropriate voltage to invert the underlying portion of the channel region if, and only if, the cell is erased, and a voltage difference is induced between the source/drain regions 174, 178. Exemplary voltages are shown below in Table 1. Vcc is assumed to be 2.7V to 3.6V. "Selected" means the memory cell is selected by the address signals. Of note, a select gate line, a control gate line, or other lines can be shared by both selected and unselected memory cells. In such cases, the "selected" voltages apply.

TABLE 1

| | SG 140 | CG 170 | BL 180 | SL 178 | P well 120 W |
|---|---|---|---|---|---|
| Read | | | | | |
| Selected: | Vcc | Vcc | 1.0 V | 0 V | 0 V |
| Not selected: | 0 V | 0 V | 0 V | 0 V | 0 V |

TABLE 1-continued

|  | SG 140 | CG 170 | BL 180 | SL 178 | P well 120 W |
|---|---|---|---|---|---|
| Program |  |  |  |  |  |
| Selected: | 2.0 V | 10.0 V | 6 V | 0 V | 0 V |
| Not selected: | 0 V | 0 V | Vcc | 0 V | 0 V |
| Erase: | 2.0 V | −10.0 V | Float | Float | 8 V |

The invention is not limited to any particular read, erase or programming techniques, to NOR memory arrays, LDD structures, to a particular array architecture or fabrication method, or to particular voltages. For example, the memory can be powered by multiple power supply voltages. Floating gates 160 (FIG. 3) can be defined using a masked etch, and can extend over sidewalls of select gate lines 140. See U.S. patent application Ser. No. 10/411,813 filed by Yi Ding on Apr. 10. 2003 and incorporated herein by reference. The source lines can be formed from a layer overlying the substrate 120 and contacting the source line substrate regions 178; the source lines do not have to go up and down the isolation trenches 220T. Also, substrate isolation regions 220 do not have to traverse the entire array. The invention is applicable to non-flash memories (e.g. non-flash EEPROMs) and to multi-level memory cells (such a cell can store multiple bits of information). Other embodiments and variations are within the scope of the invention, as defined by the appended claims.

What is claimed is:

1. An integrated circuit comprising:
   a semiconductor substrate;
   a dielectric ("select gate dielectric") on the semiconductor substrate;
   a select gate of a nonvolatile memory cell on the select gate dielectric;
   a floating gate of the nonvolatile memory cell;
   a control gate of the nonvolatile memory cell, a portion of the control gate overlying the select gate;
   a first peripheral transistor for accessing the memory cell, the first peripheral transistor comprising:
      a first peripheral transistor gate dielectric on the semiconductor substrate; and
      a gate on the first peripheral transistor gate dielectric;
   wherein the first peripheral transistor gate dielectric has the same thickness as the select gate dielectric.

2. The integrated circuit of claim 1 wherein the semiconductor substrate comprises a channel region of the memory cell, wherein the select gate controls a conductivity of a portion of the channel region, and the floating gate overlies another portion of the channel region.

3. The integrated circuit of claim 2 wherein the control gate overlies the floating gate.

4. The integrated circuit of claim 1 wherein the semiconductor substrate is a silicon substrate, and the select gate dielectric and the first peripheral transistor gate dielectric consist of silicon oxide.

5. The integrated circuit of claim 1 further comprising a dielectric ("floating gate dielectric") on the semiconductor substrate to separate the floating gate from the substrate, wherein the floating gate dielectric is made of the same material as the select gate dielectric but is thinner than the select gate dielectric.

6. The integrated circuit of claim 1 further comprising a second peripheral transistor comprising a second peripheral transistor gate dielectric on the semiconductor substrate and a gate on the second peripheral transistor gate dielectric, wherein the second peripheral transistor gate dielectric is made of the same material as the select gate transistor gate dielectric and the first peripheral transistor gate dielectric but the thickness of the second peripheral transistor gate dielectric is different from the thickness of the first peripheral transistor gate dielectric.

7. The integrated circuit of claim 6 wherein the second peripheral transistor gate dielectric is thinner than the first peripheral transistor gate dielectric.

8. The integrated circuit of claim 6 wherein the select gate dielectric as at least as thick as a gate dielectric of any peripheral transistor in said memory.

9. The integrated circuit of claim 1 wherein the memory cell is one of a plurality of nonvolatile memory cells of the integrated circuit, each memory cell comprising a dielectric ("select gate dielectric") on the semiconductor substrate, a select gate on the select gate dielectric, a floating gate, and a control gate;
   wherein the select gate dielectric of each memory cell has the same thickness as the first peripheral transistor gate dielectric.

10. The integrated circuit of claim 1 wherein during a memory cell writing operation, the first peripheral transistor is exposed to a voltage of a higher magnitude than any voltage provided to the memory cell in a reading operation.

11. The integrated circuit of claim 10 wherein during the memory cell writing operation, the first peripheral transistor is exposed to a voltage of a higher magnitude than any power supply voltage provided to the nonvolatile memory.

12. The integrated circuit of claim 1 wherein the memory cell is to support a writing operation in which the memory cell is written by a transfer of a charge between the floating gate and a channel region of the memory cell, the channel region being located in the semiconductor substrate.

* * * * *